US009263455B2

(12) United States Patent (10) Patent No.: US 9,263,455 B2
Tang et al. (45) Date of Patent: Feb. 16, 2016

(54) METHODS OF FORMING AN ARRAY OF CONDUCTIVE LINES AND METHODS OF FORMING AN ARRAY OF RECESSED ACCESS GATE LINES

(71) Applicant: Micron Technology, Inc., Boise, ID (US)

(72) Inventors: Sanh D. Tang, Boise, ID (US); Kamal M. Karda, Boise, ID (US); Wolfgang Mueller, Garden City, ID (US); Sourabh Dhir, Boise, ID (US); Robert Kerr, Boise, ID (US); Sangmin Hwang, Boise, ID (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 112 days.

(21) Appl. No.: 13/948,746

(22) Filed: Jul. 23, 2013

(65) Prior Publication Data

US 2015/0028406 A1 Jan. 29, 2015

(51) Int. Cl.
*H01L 27/108* (2006.01)
*H01L 21/762* (2006.01)
*H01L 29/66* (2006.01)

(52) U.S. Cl.
CPC .... *H01L 27/10876* (2013.01); *H01L 21/76232* (2013.01); *H01L 27/10823* (2013.01); *H01L 29/66621* (2013.01)

(58) Field of Classification Search
CPC ............... H01L 27/10876; H01L 27/10823; H01L 21/76232; H01L 29/66621
See application file for complete search history.

(56) References Cited

U.S. PATENT DOCUMENTS

| 4,437,226 A | 3/1984 | Soclof |
| 4,489,478 A | 12/1984 | Sakuri |
| 4,845,048 A | 7/1989 | Tamaki et al. |
| 5,027,184 A | 6/1991 | Soclof |
| 5,112,771 A | 5/1992 | Ishii et al. |
| 5,442,222 A | 8/1995 | Takasu |
| 5,466,621 A | 11/1995 | Hisamoto et al. |

(Continued)

FOREIGN PATENT DOCUMENTS

| DE | 10157785 | 6/2003 |
| EP | 0059264 | 9/1982 |

(Continued)

OTHER PUBLICATIONS

Ananthan, "FinFET—Current Research Issues", School of Electrical and Computer Engineering, Purdue University; 2003; 5 pp.

(Continued)

*Primary Examiner* — Howard Weiss
(74) *Attorney, Agent, or Firm* — Wells St. John, P.S.

(57) ABSTRACT

An array of recessed access gate lines includes active area regions having dielectric trench isolation material there-between. The trench isolation material comprises dielectric projections extending into opposing ends of individual active area regions under an elevationally outermost surface of material of the active area regions. The active area material is elevationally over the dielectric projections. Recessed access gate lines individually extend transversally across the active area regions and extend between the ends of immediately end-to-end adjacent active area regions within the dielectric trench isolation material. Other arrays are disclosed, as are methods.

7 Claims, 14 Drawing Sheets

(56) References Cited

U.S. PATENT DOCUMENTS

| | | | |
|---|---|---|---|
| 5,612,230 | A | 3/1997 | Yuzuihara et al. |
| 5,681,773 | A | 10/1997 | Tseng et al. |
| 5,801,083 | A | 9/1998 | Yu et al. |
| 5,963,789 | A | 10/1999 | Tsuchiaki |
| 5,972,758 | A | 10/1999 | Liang |
| 5,998,808 | A | 12/1999 | Matsushita |
| 6,232,202 | B1 | 5/2001 | Hong |
| 6,285,057 | B1 | 9/2001 | Hopper et al. |
| 6,300,215 | B1 | 10/2001 | Shin |
| 6,313,008 | B1 | 11/2001 | Leung et al. |
| 6,448,100 | B1 | 9/2002 | Schulte et al. |
| 6,465,865 | B1 | 10/2002 | Gonzalez |
| 6,482,701 | B1 | 11/2002 | Ishikawa et al. |
| 6,521,538 | B2 | 2/2003 | Soga et al. |
| 6,537,862 | B2 | 3/2003 | Song |
| 6,642,090 | B1 | 11/2003 | Fried et al. |
| 6,716,757 | B2 | 4/2004 | Lin et al. |
| 6,774,390 | B2 | 8/2004 | Sugiyama et al. |
| 6,784,076 | B2 | 8/2004 | Gonzalez et al. |
| 6,921,982 | B2 | 7/2005 | Joshi et al. |
| 7,005,347 | B1 | 2/2006 | Bhalla et al. |
| 7,160,789 | B2 | 1/2007 | Park |
| 7,220,640 | B2 | 5/2007 | Kim |
| 7,291,877 | B2 | 11/2007 | Brederlow et al. |
| 7,319,252 | B2 | 1/2008 | Chang |
| 7,326,634 | B2 | 2/2008 | Lindert et al. |
| 7,407,845 | B2 | 8/2008 | Lee et al. |
| 7,407,847 | B2 | 8/2008 | Doyle et al. |
| 7,413,955 | B2 | 8/2008 | Kim |
| 7,422,960 | B2 | 9/2008 | Fischer et al. |
| 7,537,994 | B2 | 5/2009 | Taylor et al. |
| 7,671,390 | B2 | 3/2010 | Sonsky et al. |
| 7,820,505 | B2 | 10/2010 | Brederlow et al. |
| 7,825,011 | B2 | 11/2010 | Meunier-Bellard et al. |
| 7,906,388 | B2 | 3/2011 | Sonsky |
| 7,935,602 | B2 | 5/2011 | Wang et al. |
| 7,939,403 | B2 | 5/2011 | Grisham et al. |
| 8,124,475 | B2 | 2/2012 | Brederlow et al. |
| 8,222,102 | B2 | 7/2012 | Grisham et al. |
| 8,409,946 | B2 | 4/2013 | Grisham et al. |
| 2002/0031898 | A1 | 3/2002 | Gonzalez et al. |
| 2002/0109155 | A1 | 8/2002 | Shin et al. |
| 2002/0135549 | A1 | 9/2002 | Kawata |
| 2002/0177282 | A1 | 11/2002 | Song |
| 2003/0190766 | A1 | 10/2003 | Gonzalez et al. |
| 2003/0227036 | A1 | 12/2003 | Sugiyama et al. |
| 2004/0108523 | A1 | 6/2004 | Chen et al. |
| 2004/0110358 | A1 | 6/2004 | Lee |
| 2004/0110383 | A1 | 6/2004 | Tanaka |
| 2004/0113230 | A1 | 6/2004 | Divakaruni et al. |
| 2004/0150071 | A1 | 8/2004 | Kondo et al. |
| 2004/0195610 | A1 | 10/2004 | Morikado |
| 2004/0198003 | A1 | 10/2004 | Yeo et al. |
| 2004/0198009 | A1 | 10/2004 | Chen et al. |
| 2004/0262687 | A1 | 12/2004 | Jung et al. |
| 2005/0029619 | A1 | 2/2005 | Forbes |
| 2005/0087842 | A1 | 4/2005 | Forbes |
| 2005/0136617 | A1 | 6/2005 | Jang |
| 2005/0176186 | A1 | 8/2005 | Lee et al. |
| 2005/0199932 | A1 | 9/2005 | Abbott et al. |
| 2005/0218438 | A1 | 10/2005 | Lindert et al. |
| 2005/0250279 | A1 | 11/2005 | Son et al. |
| 2005/0282342 | A1 | 12/2005 | Adan |
| 2005/0285149 | A1 | 12/2005 | Chang |
| 2006/0003526 | A1 | 1/2006 | Brederlow et al. |
| 2006/0046428 | A1 | 3/2006 | Baiocco et al. |
| 2006/0068591 | A1 | 3/2006 | Radosavljevic et al. |
| 2006/0076595 | A1 | 4/2006 | Wu |
| 2006/0157688 | A1 | 7/2006 | Bhattacharyya |
| 2006/0172497 | A1 | 8/2006 | Hareland et al. |
| 2006/0244106 | A1 | 11/2006 | Morikado |
| 2006/0292787 | A1 | 12/2006 | Wang et al. |
| 2007/0034922 | A1 | 2/2007 | Bhattacharyya |
| 2007/0082448 | A1 | 4/2007 | Kim et al. |
| 2007/0111439 | A1 | 5/2007 | Jung et al. |
| 2007/0148934 | A1 | 6/2007 | Cho et al. |
| 2007/0228383 | A1 | 10/2007 | Bernstein et al. |
| 2007/0246754 | A1 | 10/2007 | Sonsky et al. |
| 2008/0017931 | A1 | 1/2008 | Shih et al. |
| 2008/0038888 | A1 | 2/2008 | Brederlow et al. |
| 2009/0072351 | A1 | 3/2009 | Meunier-Beilard et al. |
| 2009/0127615 | A1 | 5/2009 | Sonsky |
| 2009/0184355 | A1 | 7/2009 | Brederlow et al. |
| 2010/0159683 | A1* | 6/2010 | Lee et al. .................. 438/585 |
| 2011/0156103 | A1 | 6/2011 | Penzes |

FOREIGN PATENT DOCUMENTS

| | | |
|---|---|---|
| EP | 1229579 | 8/2002 |
| JP | H05110083 | 4/1993 |
| JP | H05243573 | 9/1993 |
| JP | H11150265 | 6/1999 |
| JP | 2001093861 | 4/2001 |
| JP | 2002359369 | 12/2002 |
| JP | 2003-037272 | 2/2003 |
| JP | 2003-243667 | 8/2003 |
| JP | 2005079517 | 3/2005 |
| JP | 2005-123404 | 5/2005 |
| JP | 2005-229107 | 8/2005 |
| JP | 2006-503440 | 1/2006 |
| TW | 095120411 | 4/2008 |
| TW | 096131528 | 7/2011 |
| WO | WO 2004/038770 | 5/2004 |
| WO | WO 2005/117073 | 12/2005 |
| WO | PCT/US2006/020877 | 8/2006 |
| WO | WO 2006/109265 | 10/2006 |
| WO | WO 2006/117734 | 11/2006 |
| WO | PCT/US2006/020877 | 12/2006 |
| WO | PCT/US2007/016947 | 2/2008 |
| WO | PCT/US2007/022856 | 3/2008 |
| WO | PCT/US2007/016947 | 3/2009 |
| WO | PCT/US2007/022856 | 5/2009 |

OTHER PUBLICATIONS

Kim et al., "S-RCAT (Sphere-shaped-Recess-Channel-Array Transistor) Technology for 70nm DRAM feature size and beyond", 2005 Symposium on VLSI Technology Digest, pp. 34-35.

Yeo et al., "80 nm 512M DRAM with Enhanced Data Retention Time Using Partially-Insulated Cell Array Transistor (PiCAT)", 2004 Symposium on VLSI Technology Digest of Technology, 2004 IEEE, pp. 30-31.

* cited by examiner

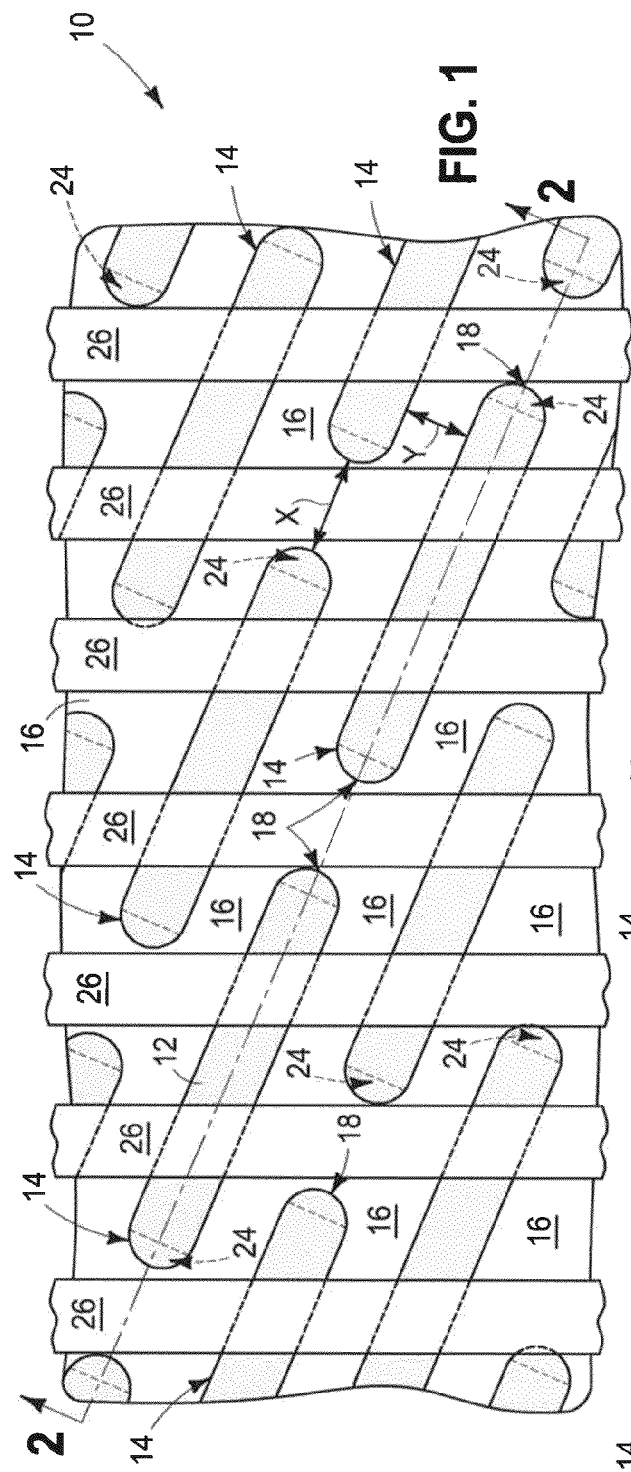
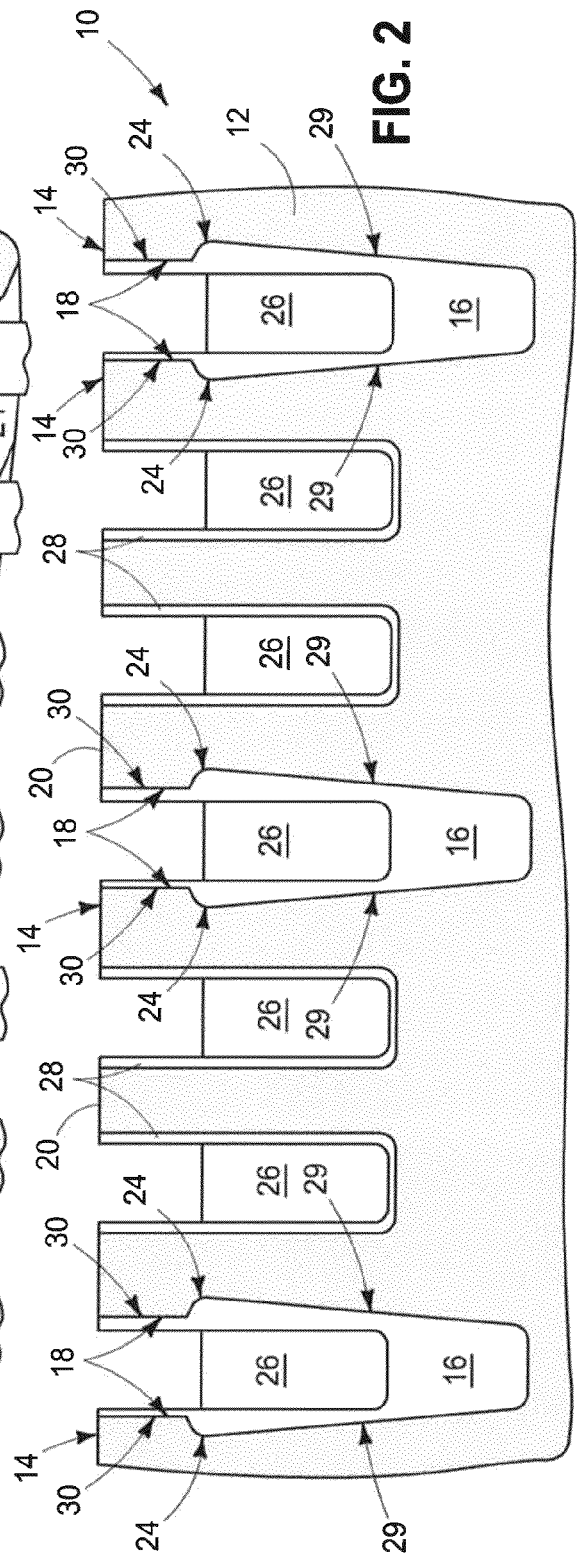

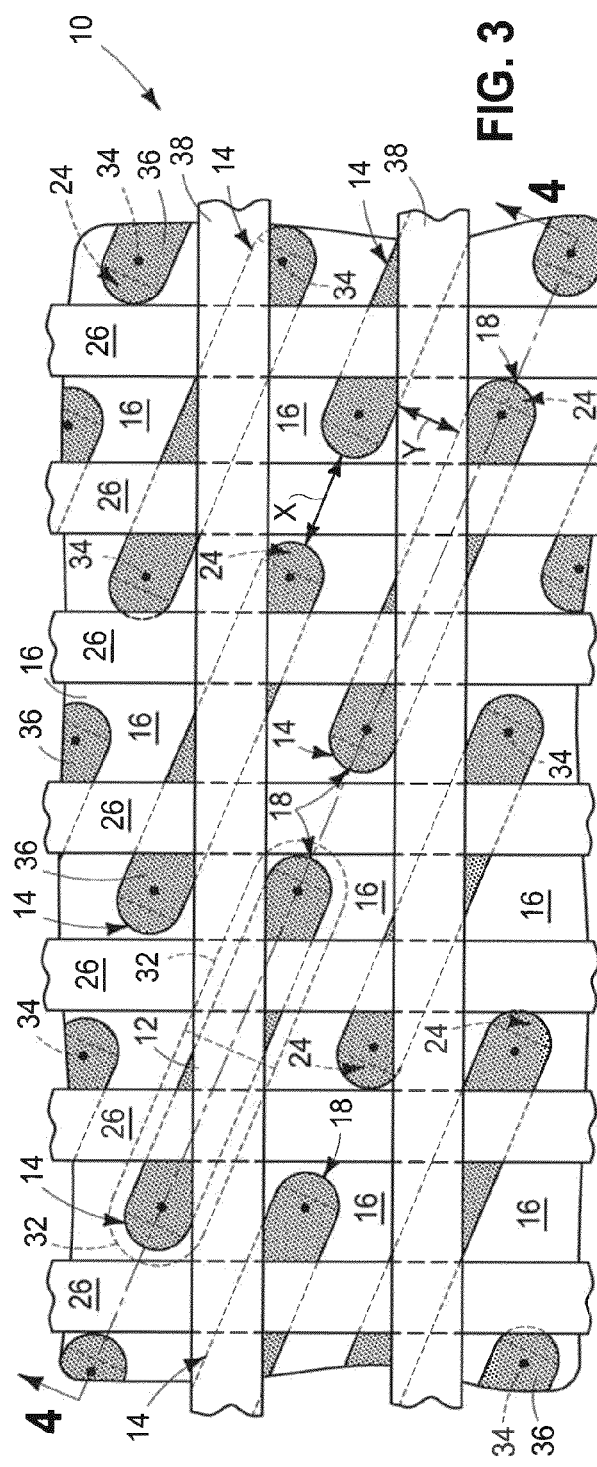
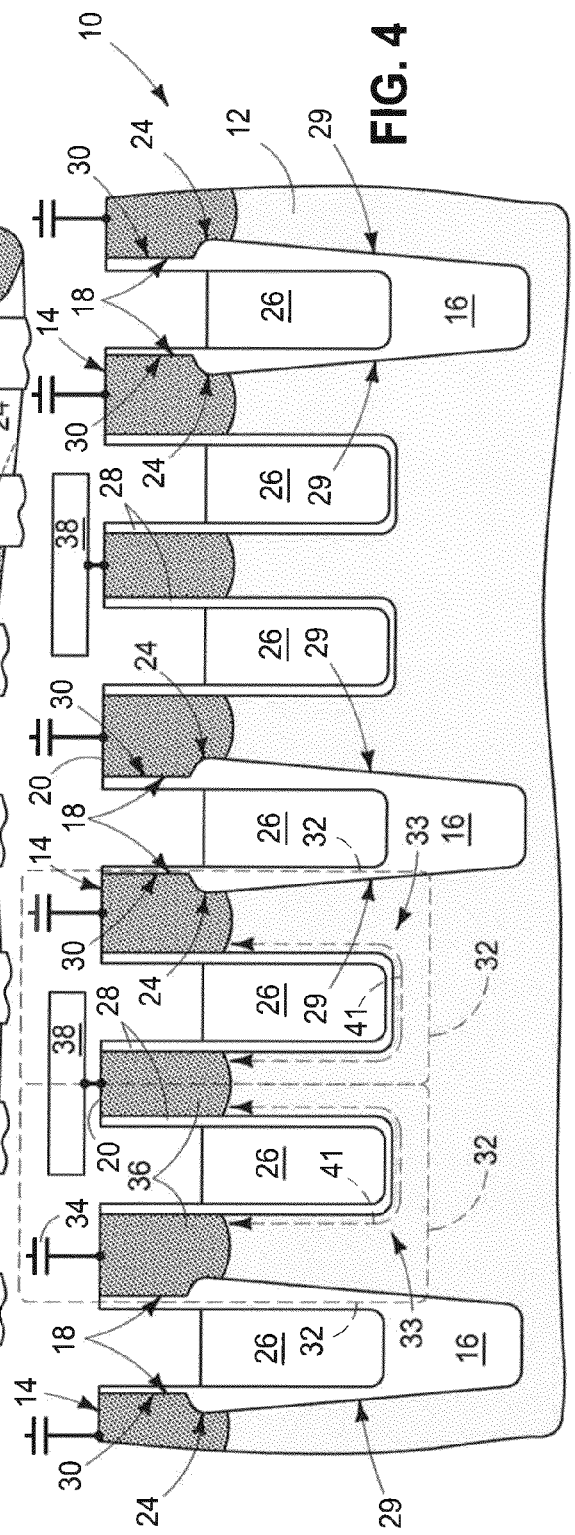

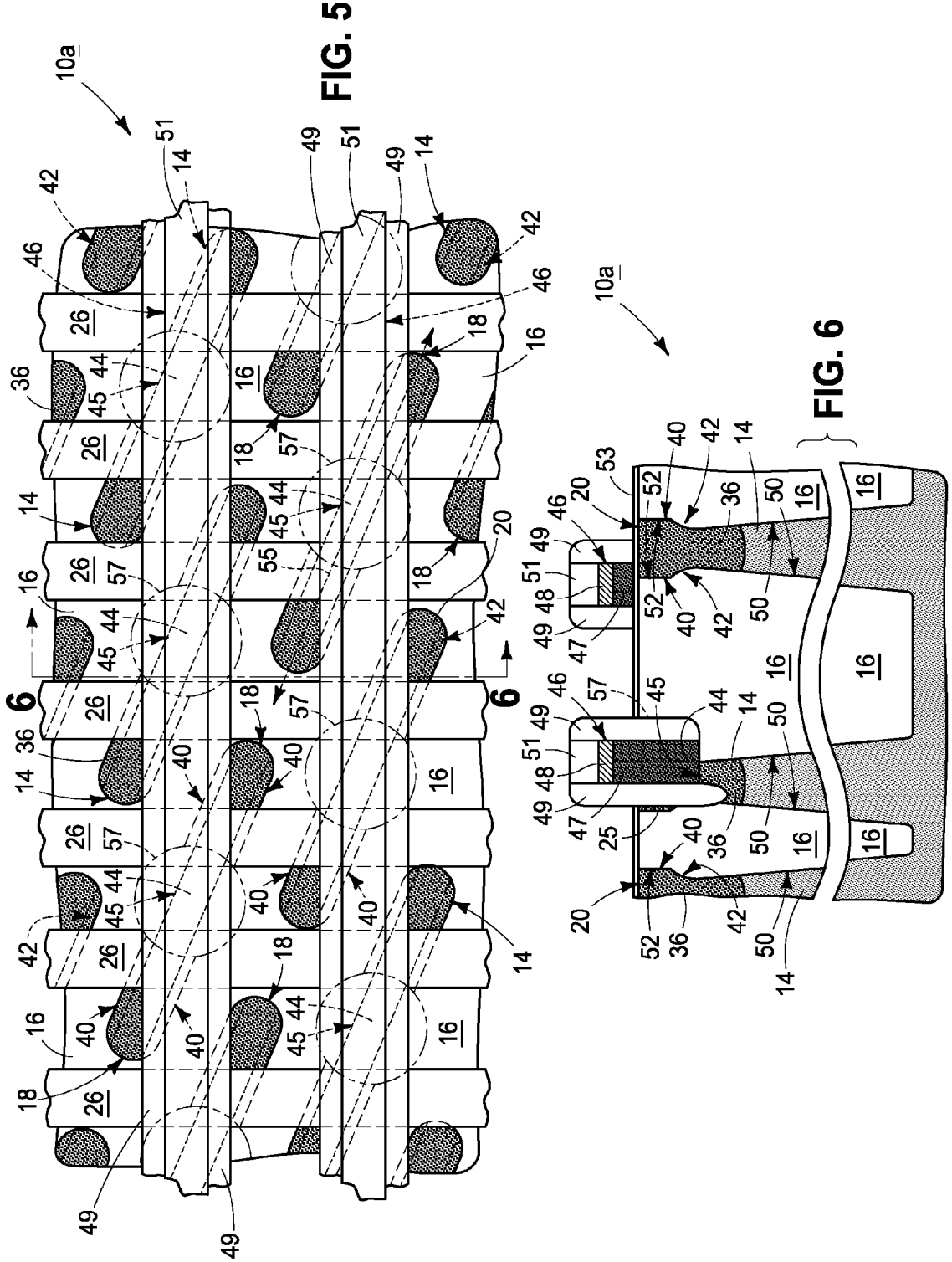

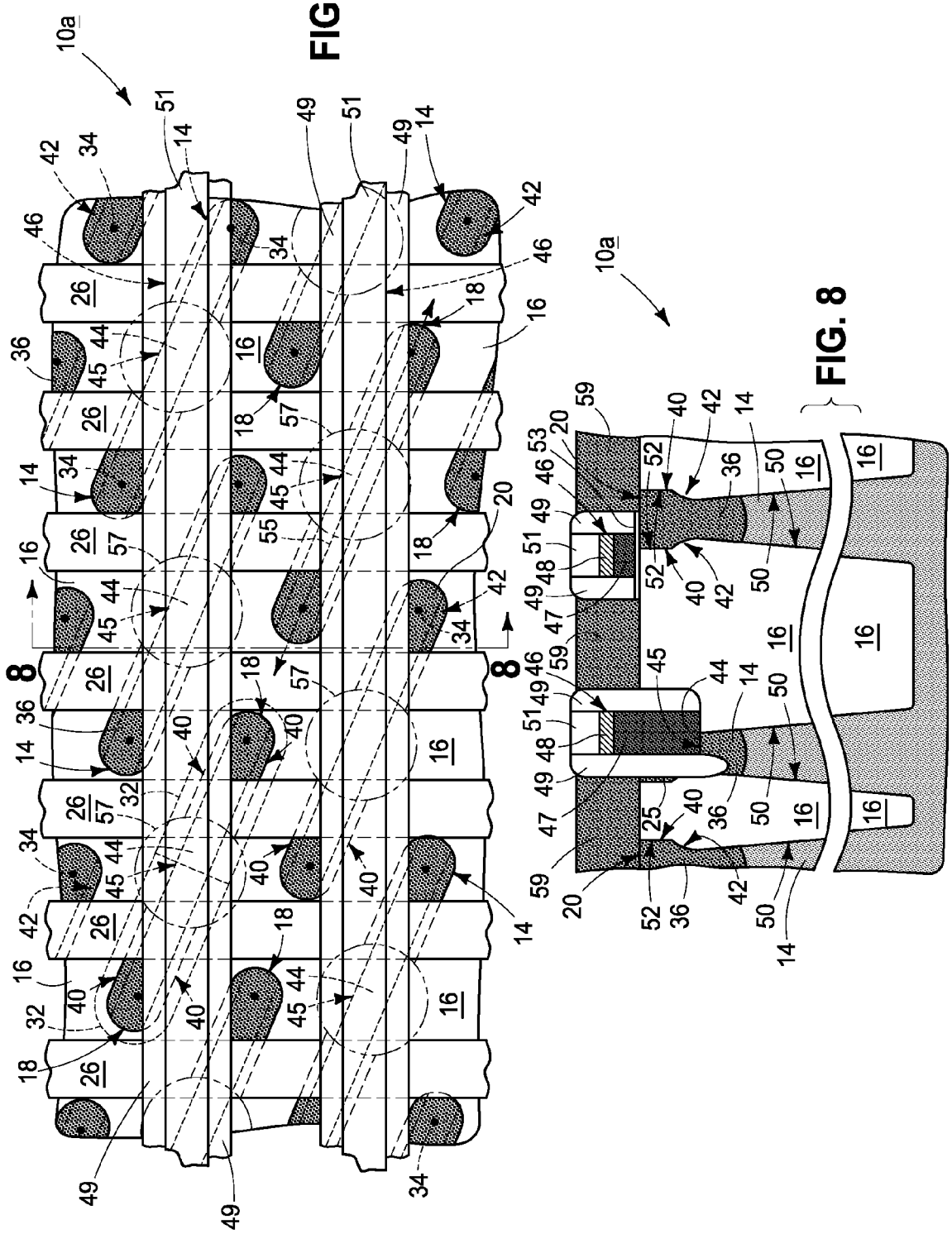

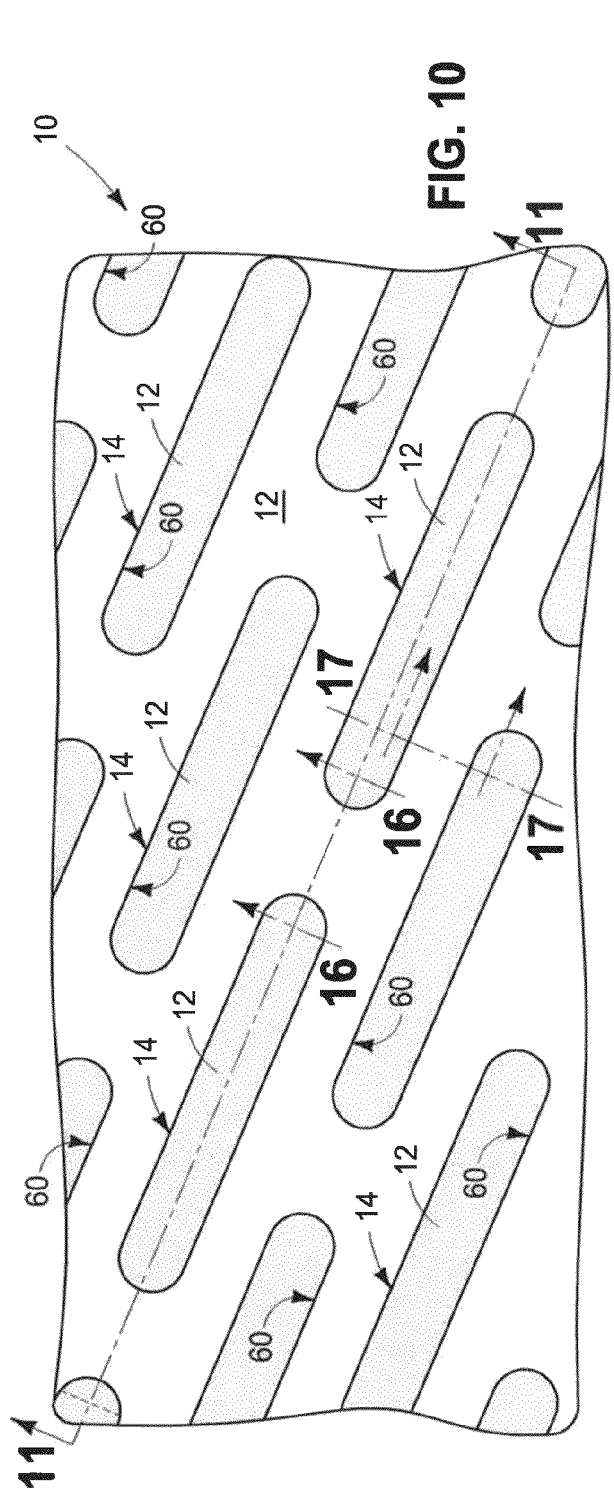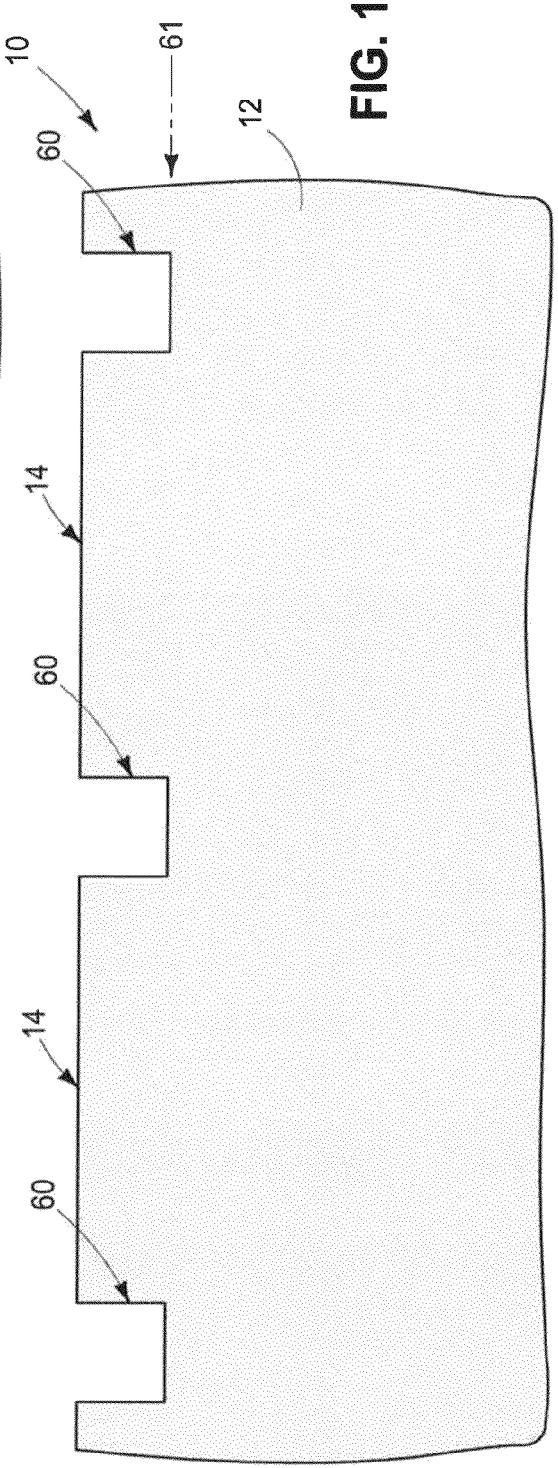

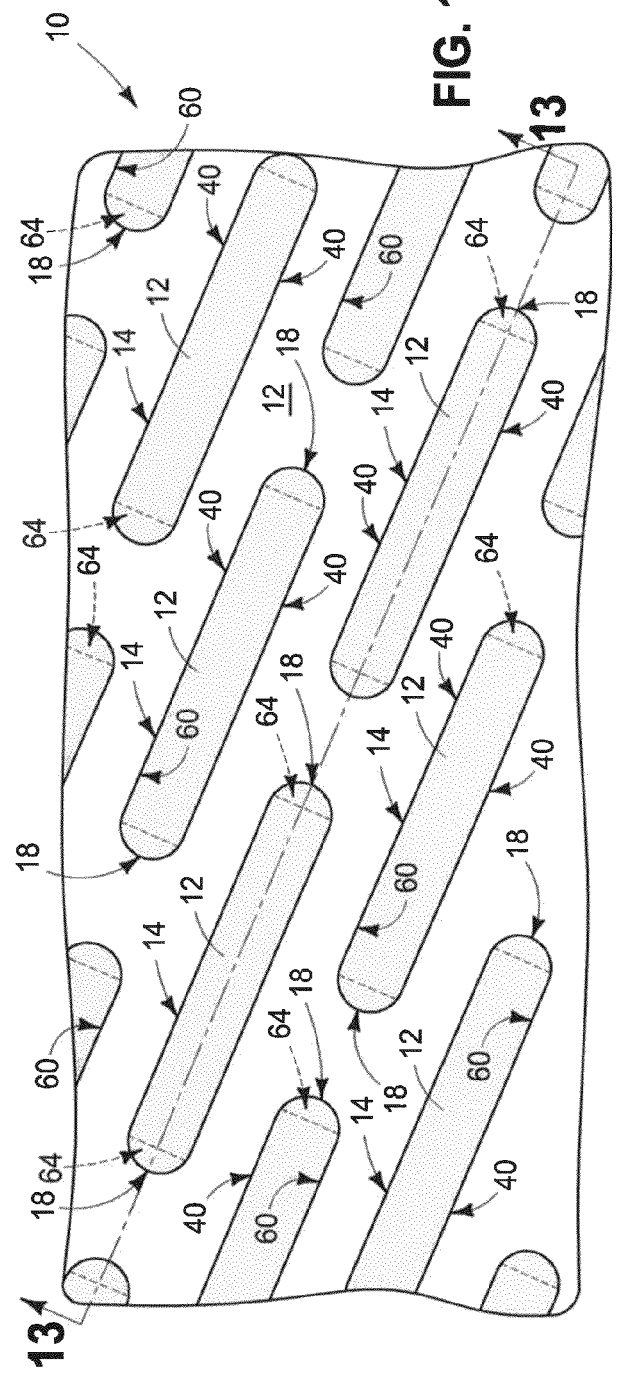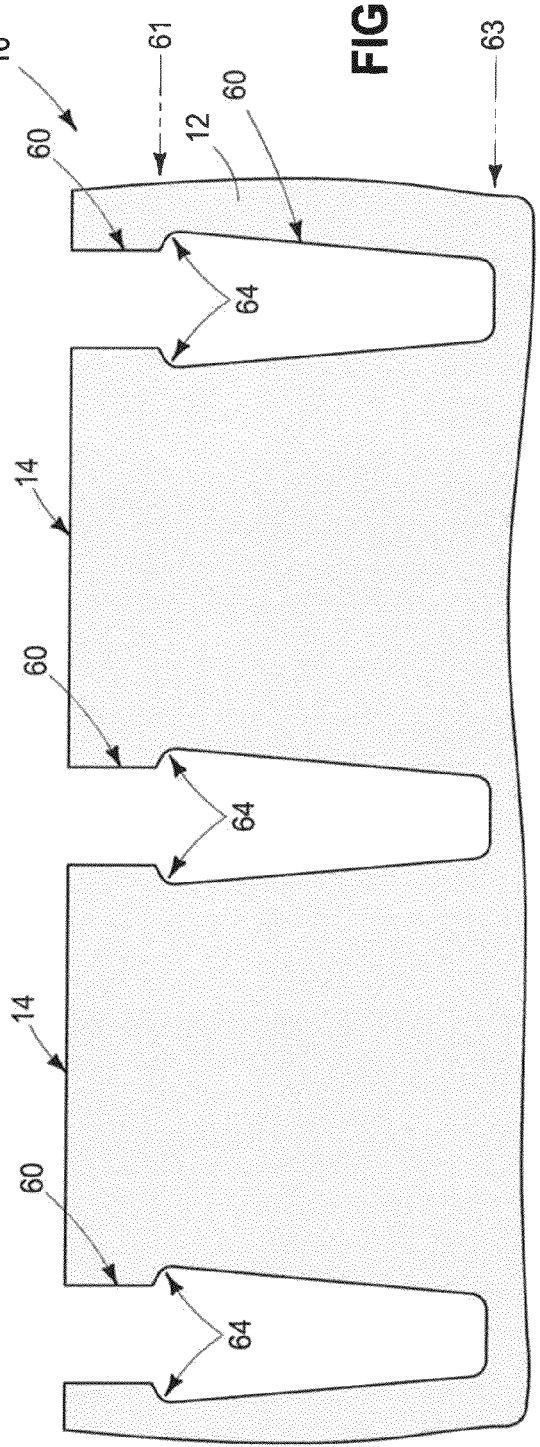

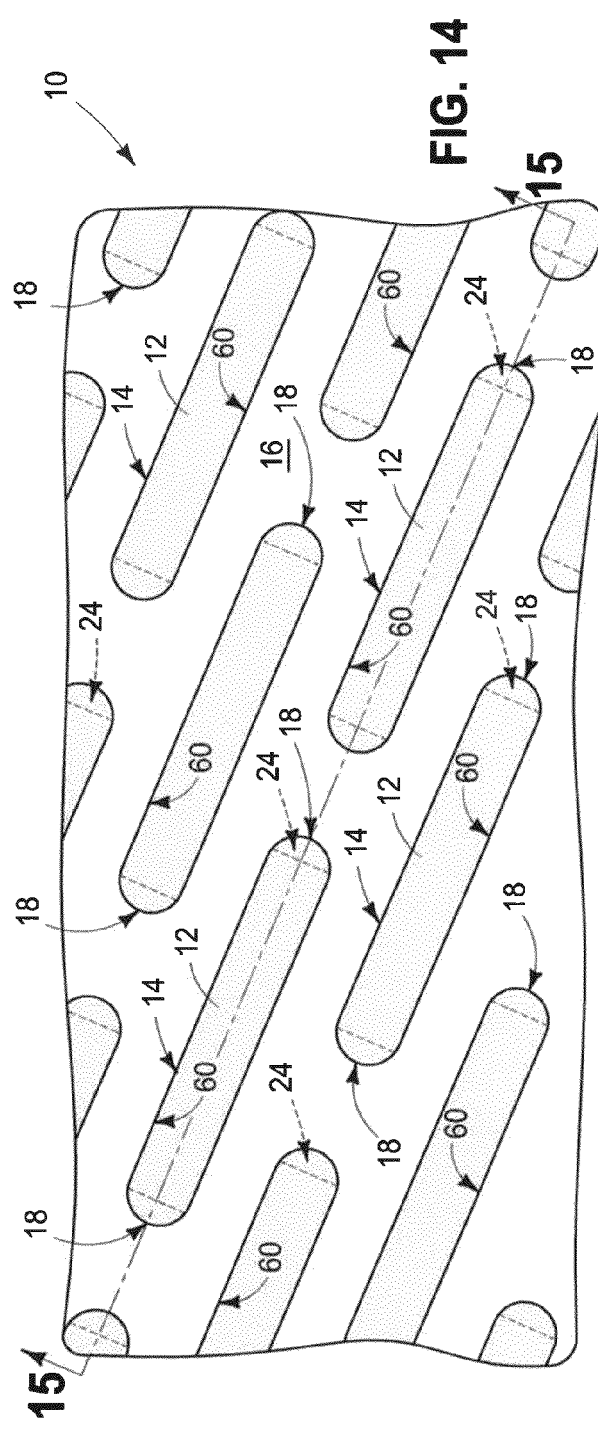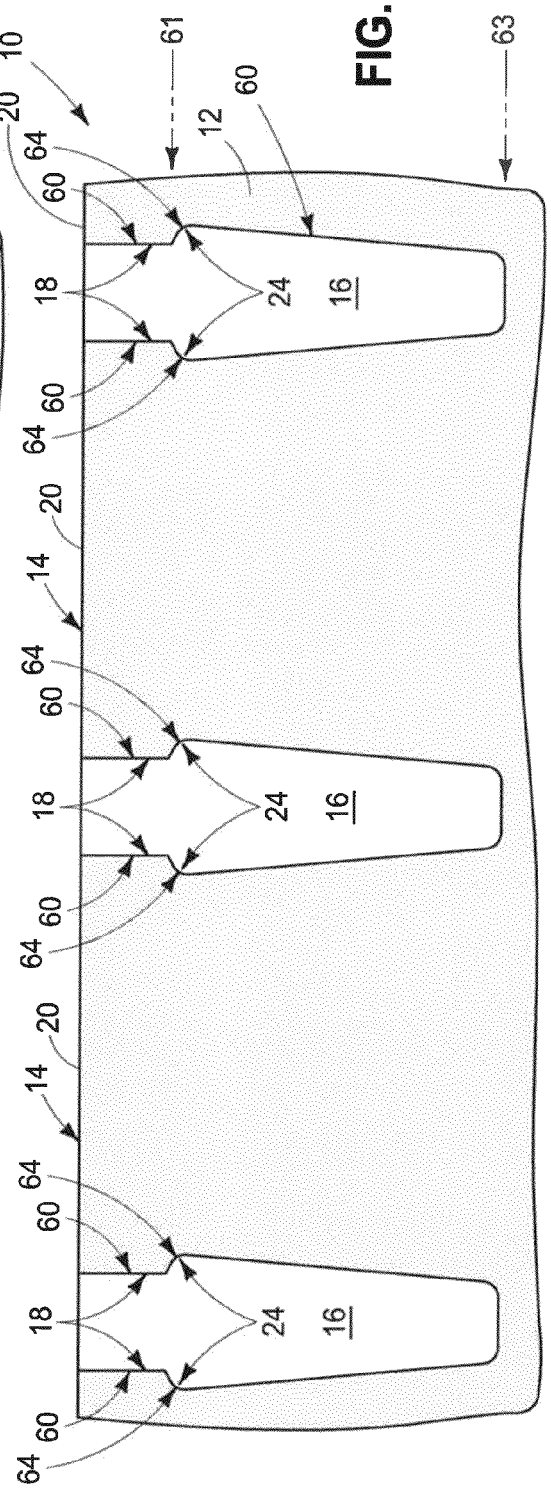

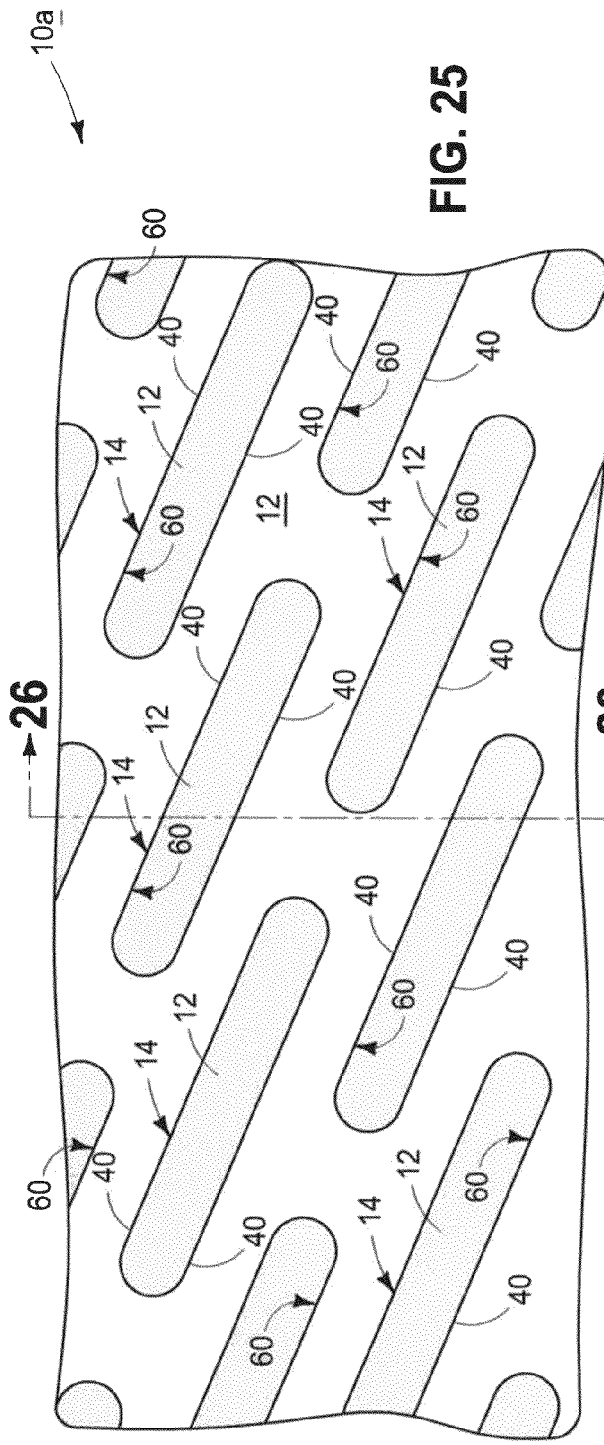
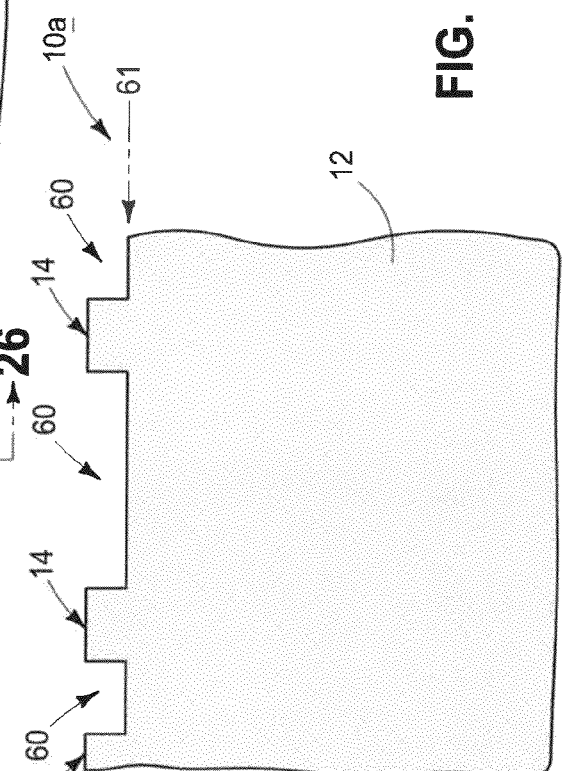
FIG. 25
FIG. 26

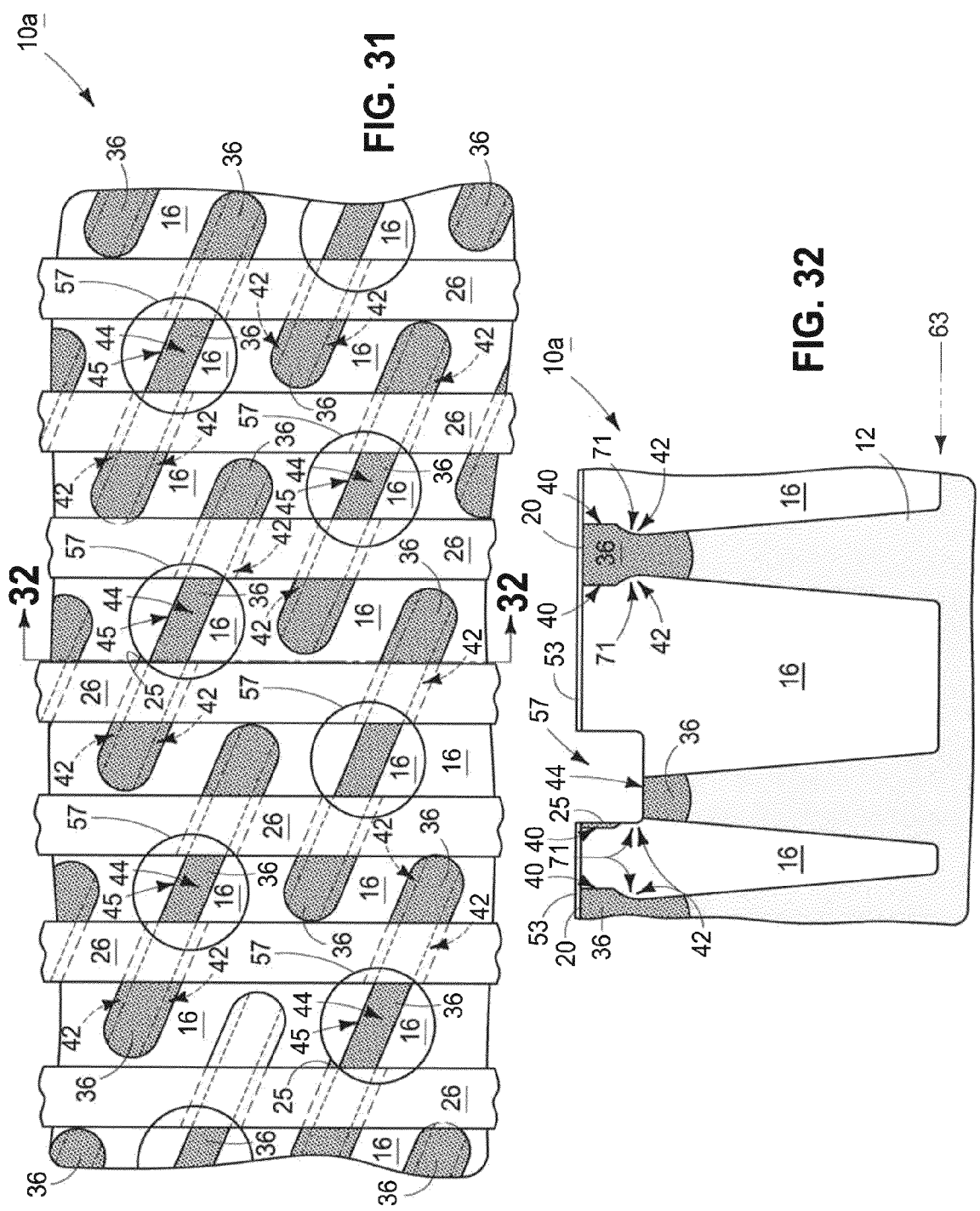

METHODS OF FORMING AN ARRAY OF CONDUCTIVE LINES AND METHODS OF FORMING AN ARRAY OF RECESSED ACCESS GATE LINES

TECHNICAL FIELD

Embodiments disclosed herein pertain to arrays of recessed access gate lines, to arrays of conductive lines, to arrays of recessed access gate lines and conductive lines, to memory circuitry, to methods of forming an array of recessed access gate lines, to methods of forming an array of conductive lines, and to methods of forming an array of recessed access gate lines and an array of conductive lines.

BACKGROUND

Integrated circuitry may be fabricated over and within semiconductor substrates. Individual device components of the circuitry may be separated or electrically isolated from other device components by dielectric or other isolation formed over and/or within the semiconductor substrate. One form of isolation is commonly referred to as trench isolation, wherein trenches are etched into semiconductor substrate material and subsequently filled with one or more dielectric materials. The trenches and isolation material therein may surround islands of semiconductor substrate material, commonly referred to as active area regions, where some of the individual circuit components are fabricated.

Integrated circuitry can be fabricated to have many functions, and may include many different electronic devices such as capacitors, transistors, resistors, diodes, etc. One type of electronic device is a recessed access device, which is a field effect transistor that has its gate construction received wholly or partially within a trench formed in semiconductor material. A gate dielectric separates the conductive gate from the semiconductor material. A pair of source/drain regions is formed within semiconductor material elevationally higher than the conductive gate materials. Application of suitable voltage to the conductive gate material within the trench enables current to flow through the semiconductor material between the source/drain regions along the trench sidewalls and around the base of the trench. The gates of recessed access devices in some circuit constructions transversally cross some active area regions and extend between other immediately end-to-end adjacent active area regions. Due to proximity of the gate material of a recessed access gate line passing between and close to the ends of active area regions, adverse circuit operation may occur. Such problems include parasitic coupling and adverse sub-threshold current leakage. Problems such as these may be mitigated by increasing the end-to-end spacing between active area regions and/or reducing the width of the recessed access gate lines. However, such techniques may have their own adverse effects.

Another challenge in integrated circuitry fabrication is interconnection of conductive lines to lower elevation circuit components. As circuit components become smaller and closer together, it becomes increasingly difficult to control critical dimension, mask alignment, and provide acceptable margins of error when forming contact openings to the lower elevation circuit components.

BRIEF DESCRIPTION OF THE DRAWINGS

FIG. 1 is a diagrammatic top plan view of a substrate in accordance with an embodiment of the invention.

FIG. 2 is a diagrammatic sectional view taken through line 2-2 in FIG. 1.

FIG. 3 is a diagrammatic top plan view of a substrate in accordance with an embodiment of the invention.

FIG. 4 is a diagrammatic sectional view taken through line 4-4 in FIG. 3.

FIG. 5 is a diagrammatic top plan view of a substrate in accordance with an embodiment of the invention.

FIG. 6 is a diagrammatic sectional view taken through line 6-6 in FIG. 5.

FIG. 7 is a diagrammatic top plan view of a substrate in accordance with an embodiment of the invention.

FIG. 8 is a diagrammatic sectional view taken through line 8-8 in FIG. 7.

FIG. 10 is a diagrammatic top plan view of a substrate in process in accordance with an embodiment of the invention.

FIG. 11 is a diagrammatic sectional view taken through line 11-11 in FIG. 10.

FIG. 12 is a view of the FIG. 10 substrate at a processing step subsequent to that shown by FIG. 10.

FIG. 13 is a diagrammatic sectional view taken through line 13-13 in FIG. 12.

FIG. 14 is a view of the FIG. 12 substrate at a processing step subsequent to that shown by FIG. 12.

FIG. 15 is a diagrammatic sectional view taken through line 15-15 in FIG. 14.

FIG. 25 is a diagrammatic top plan view of a substrate in process in accordance with an embodiment of the invention.

FIG. 26 is a diagrammatic sectional view taken through line 26-26 in FIG. 25.

FIG. 31 is a view of the FIG. 29 substrate at a processing step subsequent to that shown by FIG. 29.

FIG. 32 is a diagrammatic sectional view taken through line 32-32 in FIG. 31.

DETAILED DESCRIPTION OF EXAMPLE EMBODIMENTS

Figure 9:
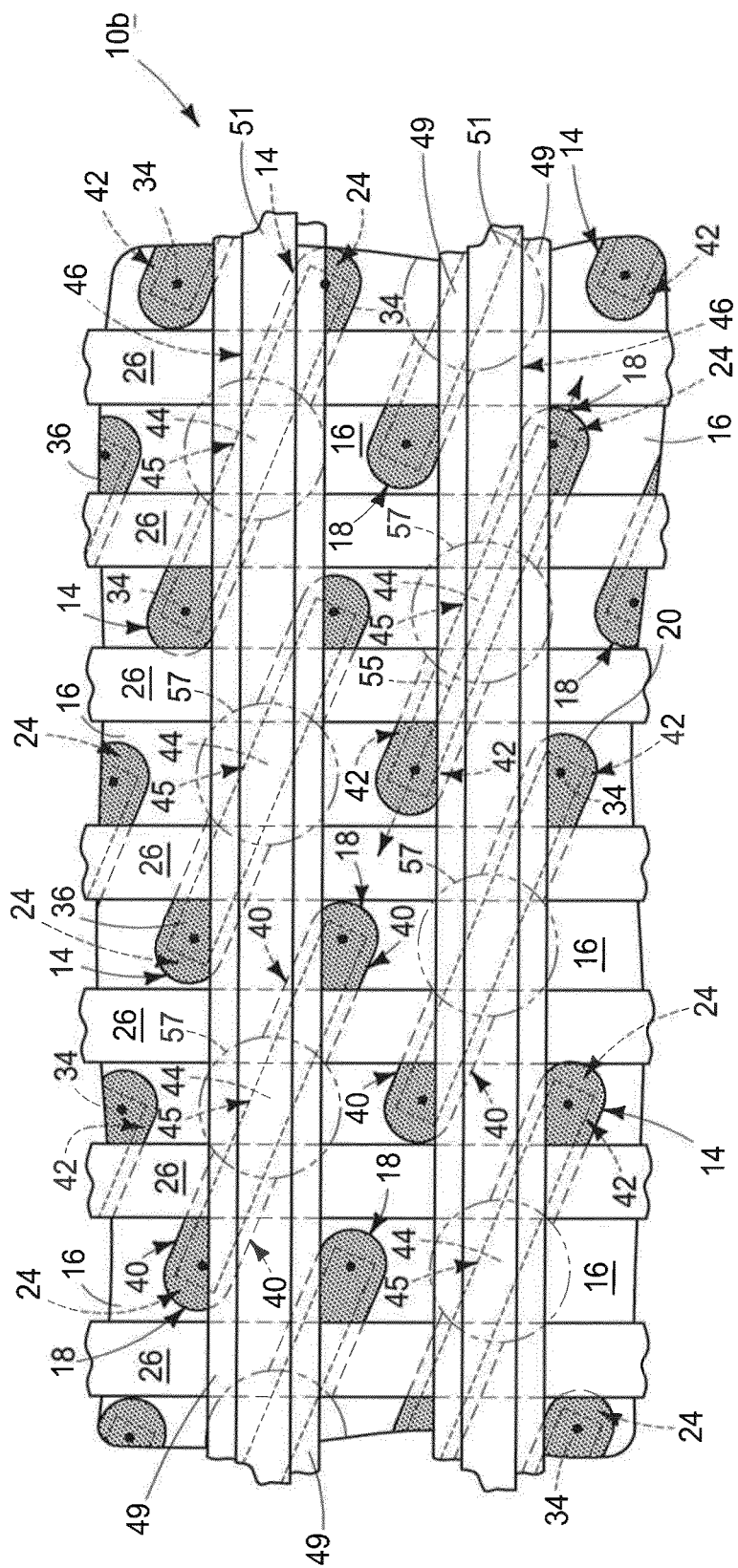
FIG. 9 is a diagrammatic top plan view of a substrate in accordance with an embodiment of the invention.

Embodiments of the invention include arrays of recessed access gate lines, arrays of conductive lines, memory circuitry, methods of forming arrays of recessed access gate lines, and methods of forming arrays of conductive lines. One embodiment of an array of recessed access gate lines is described initially with reference to FIGS. 1 and 2 with respect to a substrate fragment 10, and which comprises a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 10 is shown as comprising bulk semiconductor material 12, for example bulk monocrystalline silicon. Alternate substrates, such as semiconductor-on-insulator substrates, may be used.

Substrate 10 includes active area regions 14 comprising active area material 12 having dielectric trench isolation material 16 there-between. Any of the materials and/or structures described herein may be homogenous or non-homogenous, and regardless may be continuous or discontinuous over any material which such overlie. Further unless otherwise stated, each material may be formed using any suitable or yet-to-be-developed technique, with atomic layer deposition, chemical vapor deposition, physical vapor deposition, epitaxial growth, diffusion doping, and ion implanting being examples. Example trench isolation material is doped silicon dioxide, undoped silicon dioxide, and/or silicon nitride. Example active area material is semiconductor material, for example comprising doped or undoped monocrystalline silicon and/or polycrystalline silicon. Individual active area regions 14 may be considered as comprising opposing ends 18. Active area material 12 within active area regions 14 may be considered as having an outer surface 20. Outer surface 20 may be planar, for example as shown, and may comprise an elevationally outermost surface of active area material 12 within active area regions 14.

Trench isolation material 16 comprises dielectric projections 24 which extend into opposing ends 18 of individual active area regions 14 under elevationally outermost surface 20, with active area material 12 being elevationally over dielectric projections 24. In some embodiments, dielectric projections 24 are referred to as dielectric end projections to distinguish from dielectric lateral projections described below. An example projecting distance longitudinally into the ends of the active area regions is from about 5 to 10 nanometers from the respective furthest longitudinal extents of active area material 12 at the respective ends 18. An example depth from outermost surface 20 where dielectric projections 24 start projecting is from about 10 to 20 nanometers.

Recessed access gate lines 26 individually extend transversally across active area regions 14. Recessed access gate lines 26 also individually extend between ends 18 of immediately end-to-end adjacent active area regions 14 within dielectric trench isolation material 16. FIG. 2 shows a gate dielectric 28 positioned between recessed access gate lines 26 and active area material 12, with such not being shown in FIG. 1 for clarity in FIG. 1. FIGS. 1 and 2 show a portion of but one example array of recessed access gate lines in accordance with an embodiment of the invention.

In one embodiment and as shown (FIG. 2), dielectric trench isolation material 16 that is between ends 18 of immediately end-to-end adjacent active area regions 14 comprises opposing sidewalls 29 that taper laterally inward (i.e., relative to the trench isolation material) elevationally inward of the furthest extents of dielectric projections 24 into ends 18. In one embodiment, dielectric trench isolation material 16 between ends 18 comprises opposing sidewalls 30 that are substantially vertical elevationally outward of the furthest extents of dielectric projections 24 into ends 18. In this document, "vertical" is a direction generally perpendicular to horizontal. Further, "horizontal" refers to a general direction along a primary surface relative to which the substrate is processed during fabrication. Further as used herein, "vertical" and "horizontal" are generally perpendicular directions relative one another independent of orientation of the substrate in three-dimensional space. Further in this document, "elevational" and "elevationally" are generally with reference to the vertical direction. The sidewalls of dielectric trench isolation material 16 between end-to-end adjacent active area regions 14 may have other configurations than that which are shown.

FIGS. 1 and 2 show but one example arrangement of an array of active area regions relative to dielectric trench isolation material. Other arrangements may be used, and the individual active area regions need not all be of the same shape or configuration. FIGS. 1 and 2 also show one example embodiment wherein the individual active area regions are longitudinally elongated along a straight longitudinal axis, for example an axis such as shown in individual active area regions 14 by the section cut line 2-2 in FIG. 1. In one such embodiment and as shown, the longitudinal axes of immediately end-to-end adjacent active area regions are co-linear. Alternately by way of examples only, straight longitudinal axes of immediately end-to-end adjacent active area regions need not be co-linear (not shown), and individual active area regions need not be longitudinally elongated along a straight longitudinal axis. In one embodiment and as shown where regions 14 have a straight longitudinal axis, individual recessed access gate lines 26 cross active area regions 14 at other than an orthogonal angle to that longitudinal axis.

FIGS. 1 and 2 also show an example embodiment wherein a spacing Y between immediately side-to-side adjacent active area regions 14 is less than a spacing X between immediately end-to-end adjacent active area regions. Equal or alternate spacings may be used.

An array of recessed access gate lines in accordance with the invention may be used in any existing or yet-to-be-developed integrated circuitry. As an example, an array of recessed access gate lines may be used in memory circuitry having a plurality of memory cells, and for example where the memory cells are DRAM cells individually comprising a capacitor. Example such circuitry is diagrammatically shown in FIGS. 3 and 4. For example, FIGS. 3 and 4 show the structures of FIGS. 1 and 2 having been subsequently processed to form a plurality of DRAM cells 32 which individually comprise a recessed access device 33 and a capacitor 34. Active area material 12 has been suitably conductively-doped to form source/drain regions 36, one of which electrically couples with capacitor 34 and another of which electrically couples with a sense line 38. Recessed access device 33 has a channel 41 for current flow between source/drain regions 36 which is defined depending upon voltage applied to individual recessed access gate lines 26. Circuitry other than DRAM and circuitry other than memory may be used in an array of recessed access gate lines in accordance with embodiments of the invention.

Another embodiment in accordance with the invention is next described with reference to FIGS. 5 and 6 with respect to a substrate fragment 10a. Like numerals from the above-described embodiments have been used where appropriate, with some construction differences being indicated with the suffix "a" or with different numerals. Substrate fragment 10a comprises active area regions 14 having dielectric trench isolation material 16 there-between. Individual active area regions 14 comprise opposing sides 40 proximate opposing ends 18. Dielectric trench isolation material 16 comprises dielectric projections 42 that extend laterally into opposing sides 40 proximate opposing ends 18 under elevationally outermost surface 20 of active area material 12 proximate ends 18, with active area material 12 thereby being elevationally over dielectric projections 42 proximate ends 18. In some embodiments, dielectric projections 42 are referred to as lateral dielectric projections to distinguish from dielectric end projections as described above.

Active area regions 14 may be considered as having a mid-portion 45 having a mid-portion surface 44 which is elevationally inward relative to elevationally outermost surface 20 proximate ends 18. Conductive lines 46 individually extend transversally across and elevationally over mid-portion 45 of individual active area regions 14. Conductive material is directly against mid-portion surface 44 of active area material 12 and conductively couples with the conductive line 46 transversally crossing thereover. In this document, a material or structure is "directly against" another when there is at least some physical touching contact of the stated materials or structures relative one another. In contrast, "over", "on", and "against" not preceded by "directly", encompass "directly against" as well as construction where intervening material(s) or structure(s) result(s) in no physical touching contact of the stated materials or structures relative one another.

FIGS. 5 and 6 show conductive lines 46 as comprising conductive material 47 (e.g., conductively-doped polysilicon) and metal 48 thereover (e.g., elemental metal(s), alloys or two or more elemental metals, and/or one or more conductive metal compounds). Dielectric sidewall spacers 49 and a dielectric cap 51 may be over conductive materials 47 and 48, for example as shown. Dielectric material 53 (FIG. 6, not shown in FIG. 5 for clarity in FIG. 5) is diagrammatically shown over dielectric trench isolation material 16 and over outermost surfaces 20 of source/drain regions 36. Dielectric material (not shown) in addition to dielectric material of spacers 49 and caps 51 may additionally be over and/or between conductive lines 46. Exposure of mid-portion surface 44 may occur by etching contact openings 57 through that dielectric material selectively relative to the material(s) of spacers 49 and caps 51.

In one embodiment, dielectric trench isolation material 16 between sides 40 of immediately side-to-side adjacent active area regions 14 comprises opposing sidewalls 50 that taper laterally inward (i.e., relative dielectric trench isolation material 16) elevationally inward of furthest extents of dielectric projections 42 into sides 40 of those immediately side-to-side adjacent active area regions 14. In one embodiment, dielectric trench isolation material 16 between sides 40 comprises opposing sidewalls 52 that are substantially vertical elevationally outward of furthest lateral extents of dielectric projections 42 into sides 40. An example projecting distance laterally into the active area regions is from about 5 to 10 nanometers from the furthest lateral extents of the active area material of the respective sides 40. An example depth from outermost surface 20 where dielectric projections 42 start projecting is from about 10 to 20 nanometers.

In one embodiment, individual active area regions 14 are longitudinally elongated along a straight longitudinal axis, for example a respective axis 55 as shown in FIG. 5 (only one being shown for clarity in FIG. 5). In one such embodiment, individual active area regions 14 have their mid-portion surface 44 to be laterally narrower perpendicular to longitudinal axis 55 than are elevationally outermost surfaces 20 proximate ends 18. Further, in accordance with an embodiment of the invention, mid-portion surfaces 44 may be laterally so narrower independent of whether such mid-portion surfaces are elevationally inward relative to the elevationally outermost surfaces proximate opposing active area ends 18.

Any other attribute as described above with respect to the FIGS. 1 and 2 embodiments may be in used in the FIGS. 5 and 6 embodiments. Further, recessed access gate lines need not be used in conjunction with the array of conductive lines embodiments of the invention.

An array of conductive lines in accordance with the invention may be used in any existing or yet-to-be-developed integrated circuitry. As examples, the conductive lines may be interconnect lines, may be sense lines, and/or may be gate lines. As a specific example, an array of recessed access gate lines may be used in memory circuitry having a plurality of memory cells, and for example where the memory cells are DRAM cells individually comprising a capacitor. Example such circuitry 10a is diagrammatically shown in FIGS. 7 and 8 analogous to that of FIGS. 4 and 5, and wherein like numerals for like-compositions/structures have been used. Conductive contact plugs 59 (FIG. 8, not shown in FIG. 7 for clarity in FIG. 7) may be formed which connect with and/or constitute a part of a capacitor electrode storage node of a respective capacitor 34 that is formed elevationally over the source/drain regions at the ends of active area regions 14. A structure 25 (FIGS. 5 and 8; e.g., a sliver) of conductively doped active area material 12 may exist in some locations, and which is separated from shorting with the source/drain region 36 underlying conductive material 47 by dielectric material, such as dielectric material of spacers 49. Regardless, circuitry other than DRAM and circuitry other than memory may be used in an array of conductive lines in accordance with embodiments of the invention. In FIGS. 7 and 8, conductive lines 46 may be sense/digit lines.

Embodiments of the invention include combining at least some of the variously described and shown aspects in an array of recessed access gate lines and conductive lines, for example as shown with respect to a substrate fragment 10b in FIG. 9. Like numerals from the above-described embodiments have been used where appropriate, with some construction differences being indicated with the suffix "b" or with different numerals. Substrate fragment 10b includes active area regions 14 having dielectric trench isolation material 16 there-between. Dielectric trench isolation material 16 comprises dielectric end projections 24 extending into opposing ends 18 of individual active area regions 14 under elevationally outermost surface 20 of active area material 12. Active area material 12 is elevationally over dielectric end projections 24. Dielectric trench isolation material 16 also comprises dielectric lateral projections 42 extending laterally into opposing sides 40 proximate ends 18 under elevationally outermost surface 20 of active area material 12. Active area material 12 is elevationally over dielectric lateral projections 42 proximate ends 18. Recessed access gate lines 26 individually extend transversally across active area regions 14. Recessed access gate lines 26 also extend between ends 18 of immediately end-to-end adjacent active area regions 14 within dielectric trench isolation material 16. Conductive lines 46 individually extend transversally across and elevationally over a mid-portion 45 of individual active area regions 14. Conductive material is directly against a mid-portion surface 44 of the active area material 12 of individual active area regions 14 and is conductively coupled to the conductive line 46 transversally crossing there-over.

In one embodiment, the mid-portion surface is elevationally inward relative to the elevationally outermost surface of active area material in the individual active area regions proximate the opposing ends. In one embodiment, the individual active area regions are longitudinally elongated along a straight longitudinal axis. The mid-portion surface is laterally narrower perpendicular to the longitudinal axis than the elevationally outermost surfaces proximate the opposing ends independent of whether the mid-portion surface is elevationally inward relative to the elevationally outermost surface of the active area material proximate the opposing ends.

The embodiment of FIGS. 1 and 2, and other embodiments, may be fabricated using any existing or yet-to-be-developed techniques(s). An embodiment of the invention encompasses a method of forming an array of recessed access gate lines, for example those as shown in FIGS. 1 and 2. Such is described with reference to FIGS. 10-15, 1, and 2. Like numerals from the above-embodiments have been used where appropriate. FIGS. 10 and 11 show a predecessor substrate 10 to that shown in FIGS. 1 and 2. Isolation trenches 60 have been etched into semiconductor material 12 to a first depth 61 to define outlines of active area regions 14.

Referring to FIGS. 12 and 13, isolation trenches 60 have been etched deeper into semiconductor material 12 to a second depth 63. The etching to the second depth projects isolation trenches 60 longitudinally into opposing ends 18 of active area regions 14 below first depth 61, thereby forming projecting portions 64. In one embodiment and as shown in FIGS. 12 and 13, the deeper etching does not project isolation trenches 60 into opposing sides 40 of active area regions 14 longitudinally along all of individual active area regions 14 below first depth 61. Alternately as an example, the deeper etching may project the isolation trenches into opposing sides of the individual active area regions longitudinally along all of the individual active area regions below the first depth (not shown), for example for use in ultimately producing the structure as shown in FIG. 9 as-described above.

Referring to FIGS. 14 and 15, dielectric trench isolation material 16 has been formed in extended isolation trenches 60, including projection portions 64, to form dielectric projections 24 extending into opposing ends 18 of individual active area regions 14 under elevationally outermost surface 20 of semiconductor material 12 of active area regions 14. Semiconductor material 12 is elevationally over dielectric projections 24.

Referring to FIGS. 1 and 2 (as above), recessed access gate lines 26 have been formed and individually extend transversally across active area regions 14. Recessed access gate lines 26 are also formed to individually extend between ends 18 of immediately end-to-end adjacent active area regions 14 within dielectric trench isolation material 16. Other attributes as described above in the structure embodiments may be used in the methods embodiments.

Figure 16:
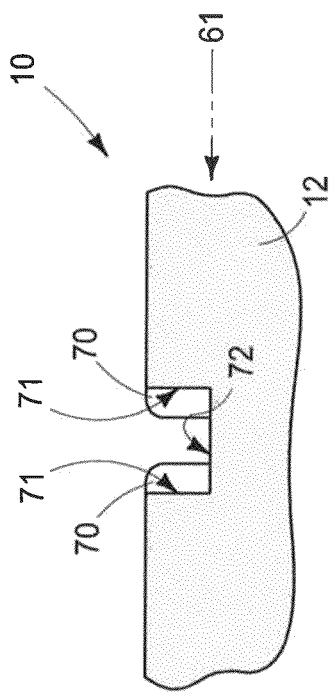
FIG. 16 is a diagrammatic sectional view taken through line 16-16 in FIG. 12.
Figure 17:
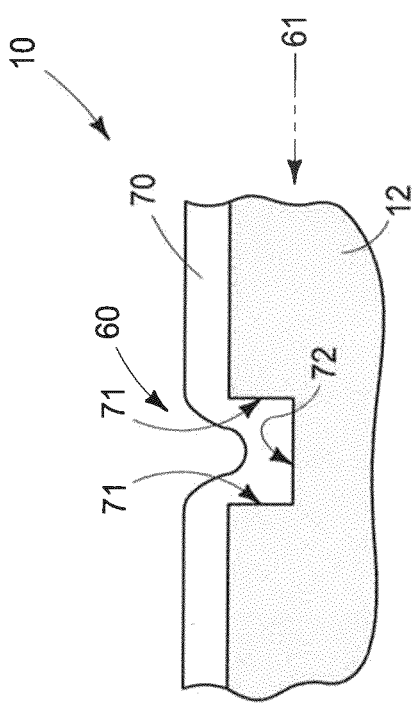
FIG. 17 is a diagrammatic sectional view taken through line 17-17 in FIG. 12.

Any suitable technique(s) may be used in etching the isolation trenches deeper to the second depth. One such example is described with reference to FIGS. 16-24. Referring to FIGS. 16 and 17, masking material 70 has been formed over sidewalls 71 and bases 72 of isolation trenches 60 of FIGS. 12 and 13. FIGS. 16 and 17 are diagrammatic cross-sectional views as would be taken through lines 16-16 and 17-17, respectively, in FIG. 10 after formation of the masking material. Masking material 70 is thicker centrally over isolation trench bases 72 that are between immediately side-to-side adjacent active area regions 14 (FIG. 17) than centrally over isolation trench bases 72 that are between immediately end-to-end adjacent active area regions (FIG. 16).

Figure 18:
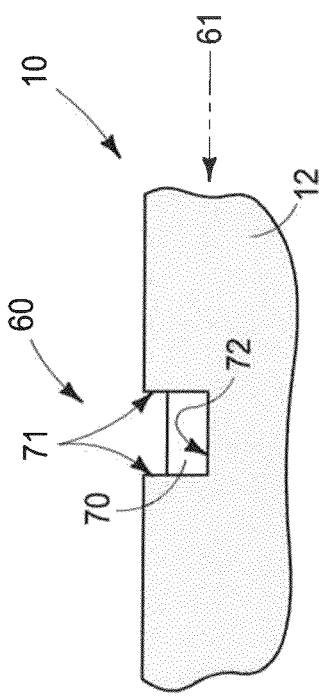
FIG. 18 is a view of the FIG. 16 substrate at a processing step subsequent to that shown by FIG. 16.
Figure 19:
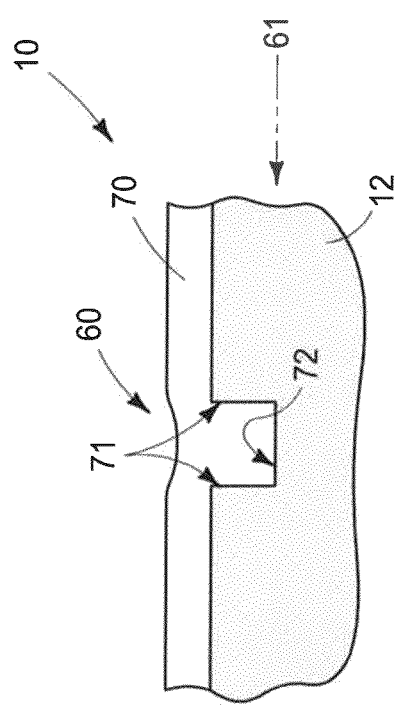
FIG. 19 is a view of the FIG. 17 substrate at a processing step subsequent to that shown by FIG. 17.

Referring to FIGS. 18 and 19, masking material 70 has been etched to centrally expose isolation trench bases 72 that are between immediately end-to-end adjacent active area regions 14 (FIG. 18) but not expose isolation trench bases 72 that are centrally between immediately side-to-side adjacent active area regions 14 (FIG. 19).

Figure 20:
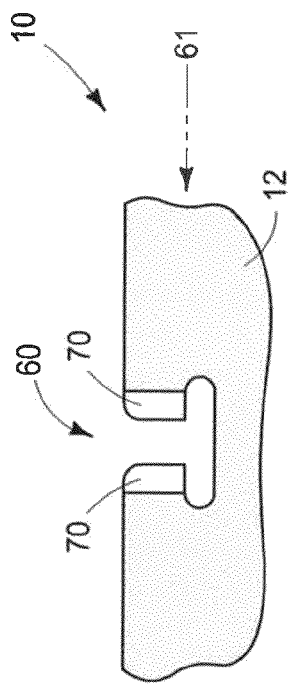
FIG. 20 is a view of the FIG. 18 substrate at a processing step subsequent to that shown by FIG. 18.

Referring to FIG. 20, first etching has been conducted of semiconductor material 12 to project isolation trenches 60 longitudinally into opposing ends of individual active area regions 14 below first depth 61. Masking material 70 of FIG. 19 precludes etching of material 12 in that cross section.

Figure 21:
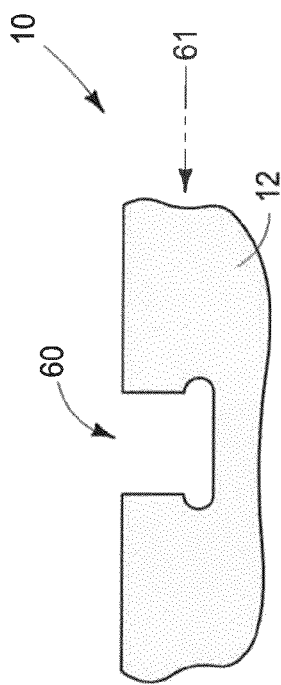
FIG. 21 is a view of the FIG. 20 substrate at a processing step subsequent to that shown by FIG. 20.
Figure 22:
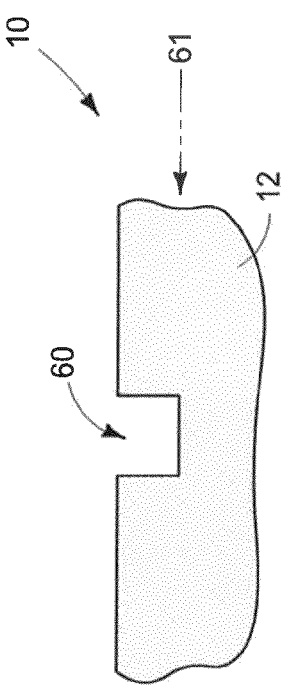
FIG. 22 is a view of the FIG. 19 substrate at a processing step subsequent to that shown by FIG. 19, and corresponds in processing sequence to that of FIG. 21.

Referring to FIGS. 21 and 22, all of masking material 70 (not shown) has been removed from isolation trenches 60. (Alternately, the masking material may be removed at the conclusion of the FIGS. 23 and 24 etching described below.)

Figure 23:
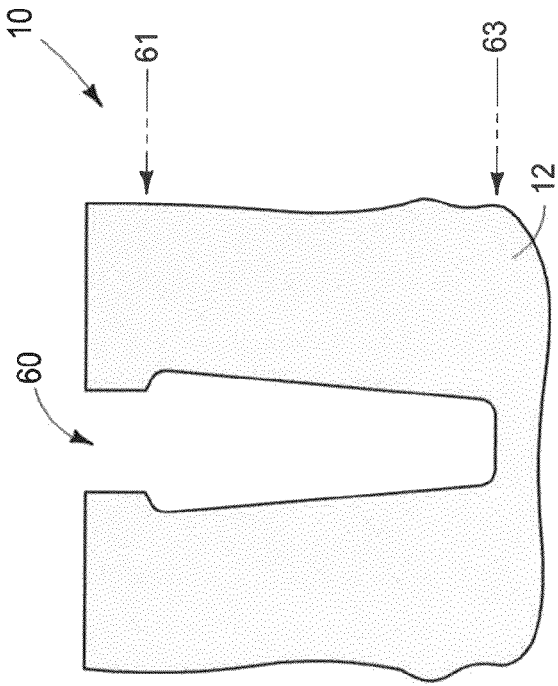
FIG. 23 is a view of the FIG. 21 substrate at a processing step subsequent to that shown by FIG. 21.
Figure 24:
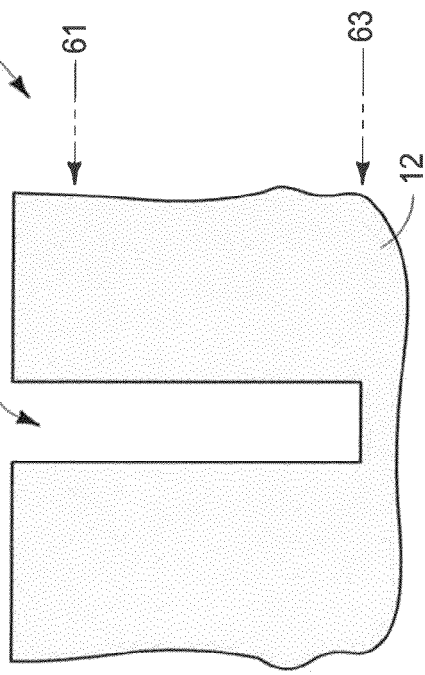
FIG. 24 is a view of the FIG. 22 substrate at a processing step subsequent to that shown by FIG. 22.

Referring to FIGS. 23 and 24, second etching of semiconductor material 12 has been conducted to extend trenches 60 to second depth 63.

Masking material 70 may be formed and substrate material 12 may be etched to produce the example desired profiles using any existing or yet-to-be-developed techniques. By way of examples only, where active area material 12 comprises elemental silicon, an example technique for producing the isolation trench outline as shown in FIGS. 10 and 11 includes a substantially anisotropic silicon etch in a suitable chamber at a pressure of from about 20 mTorr to 50 mTorr; substrate susceptor temperature at from about 10° C. to 70° C.; power to the chamber at from about 600 Watts to 950 Watts; HBr flow to the chamber at from about 300 sccm to 600 sccm; and He flow to the chamber at from about 300 sccm to 500 sccm. Where for example masking material 70 comprises silicon dioxide, such may be deposited as a conformal layer over material 12 to produce the construction of FIGS. 16 and 17 by chemical vapor deposition, atomic layer deposition, or oxidation, and any of which could be conducted with or without plasma. As a more specific example as a plasma oxidation, in a first step, the substrate could be positioned within a suitable deposition chamber at a pressure maintained at from about 15 mTorr to 40 mTorr; substrate susceptor temperature at from about 10° C. to 70° C.; $O_2$ flow to the chamber at from about 60 sccm to 120 sccm; bias power on the substrate at 0 watts; and power to the chamber at from about 600 Watts to 900 Watts. In a second step following the first, the same parameters could be used, changing the bias power to about 50 Watts to 100 Watts.

Producing the structures of FIGS. 18 and 19 from that of FIGS. 16 and 17 can be conducted by a timed etch, for example at a pressure of from about 10 mTorr to 30 mTorr; substrate susceptor temperature from about 10° C. to 70° C.; power at from about 800 Watts to 1,000 Watts; HBr flow at from about 150 sccm to 300 sccm; $CF_4$ flow at from about 1,000 sccm to 2,000 sccm. An example etching chemistry to produce the structure of FIG. 20 from that of FIG. 18 includes a substantially isotropic etch of silicon, for example chamber pressure at from about 10 mTorr to 30 mTorr, substrate susceptor temperature at from about 10° C. to 70° C.; chamber power at from about 900 Watts to 1,200 Watts; $SF_6$ flow to the chamber at from about 20 sccm to 50 sccm; and Ar flow at from about 200 sccm to 500 sccm. The masking material could then be selectively etched from the substrate. The etching described above for producing the structure of FIGS. 10 and 11 could then be used with respect to the substrate of FIGS. 21 and 22 to produce the substrate of FIGS. 23 and 24.

Embodiments of the invention also include a method of forming an array of conductive lines, for example the conductive lines shown in the example embodiment of FIGS. 5 and 6. An example such method is next described with reference to FIGS. 25-32 with respect to a substrate fragment 10a which is a predecessor substrate to that shown in FIGS. 5 and 6. Like numerals from the above embodiments have been used where appropriate.

Referring to FIGS. 25 and 26, isolation trenches 60 have been etched into semiconductor material 12 to a first depth 61 to define outlines of active area regions 14.

Figure 27:
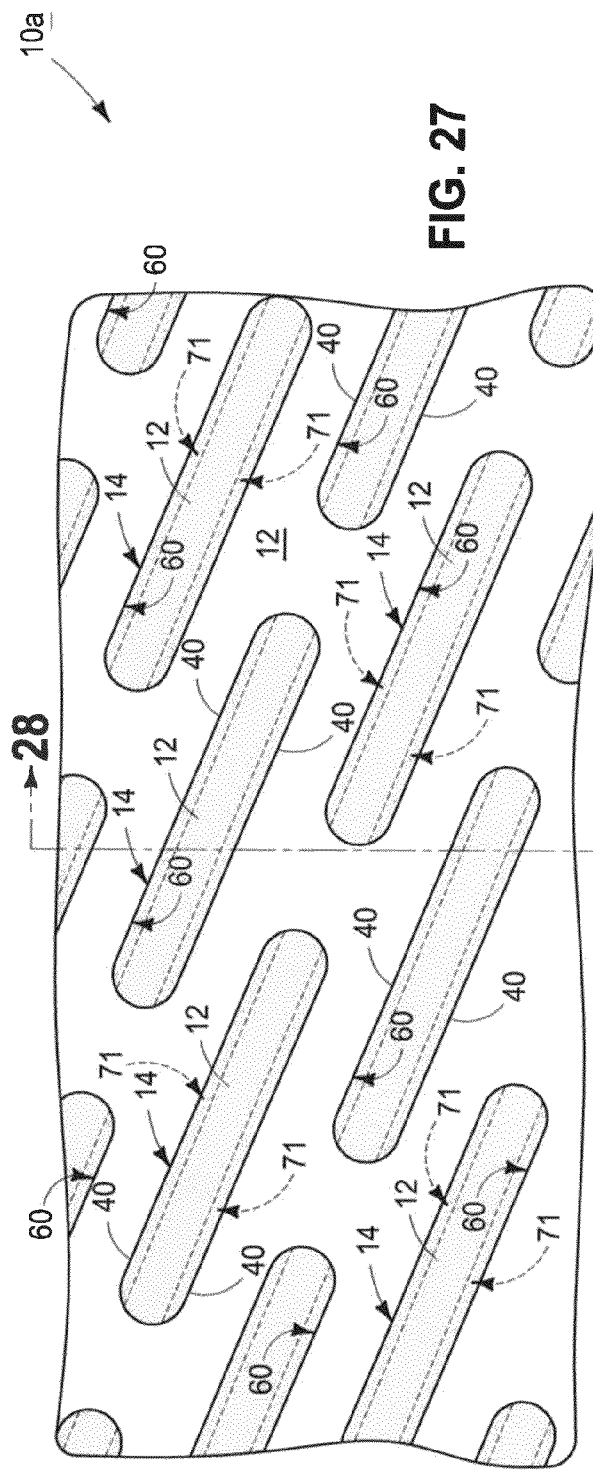
FIG. 27 is a view of the FIG. 25 substrate at a processing step subsequent to that shown by FIG. 25.
Figure 28:
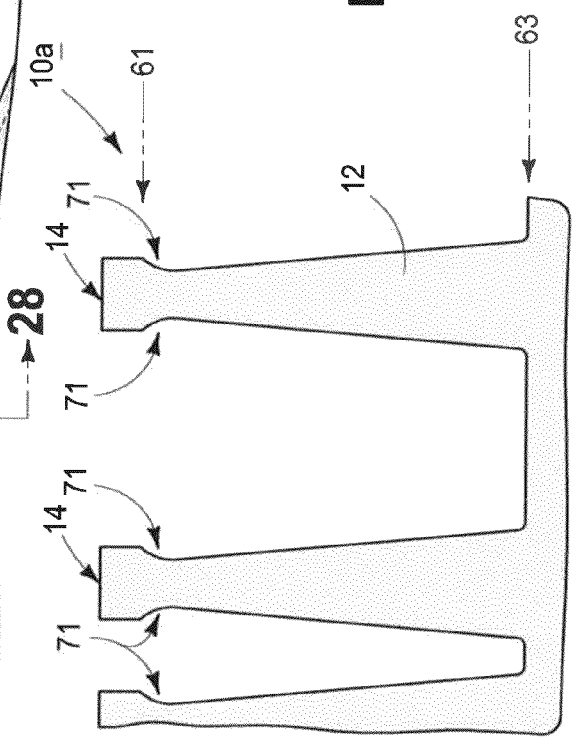
FIG. 28 is a diagrammatic sectional view taken through line 28-28 in FIG. 27.

Referring to FIGS. 27 and 28, isolation trenches 60 have been etched deeper into semiconductor material 12 to a second depth 63. The etching to the second depth projects isolation trenches 60 laterally into opposing sides 40 of individual active area regions 14 below first depth 61, thereby forming projecting portions 71. Any suitable technique, including those described above with reference to FIGS. 16-24, may be used.

Figure 29:
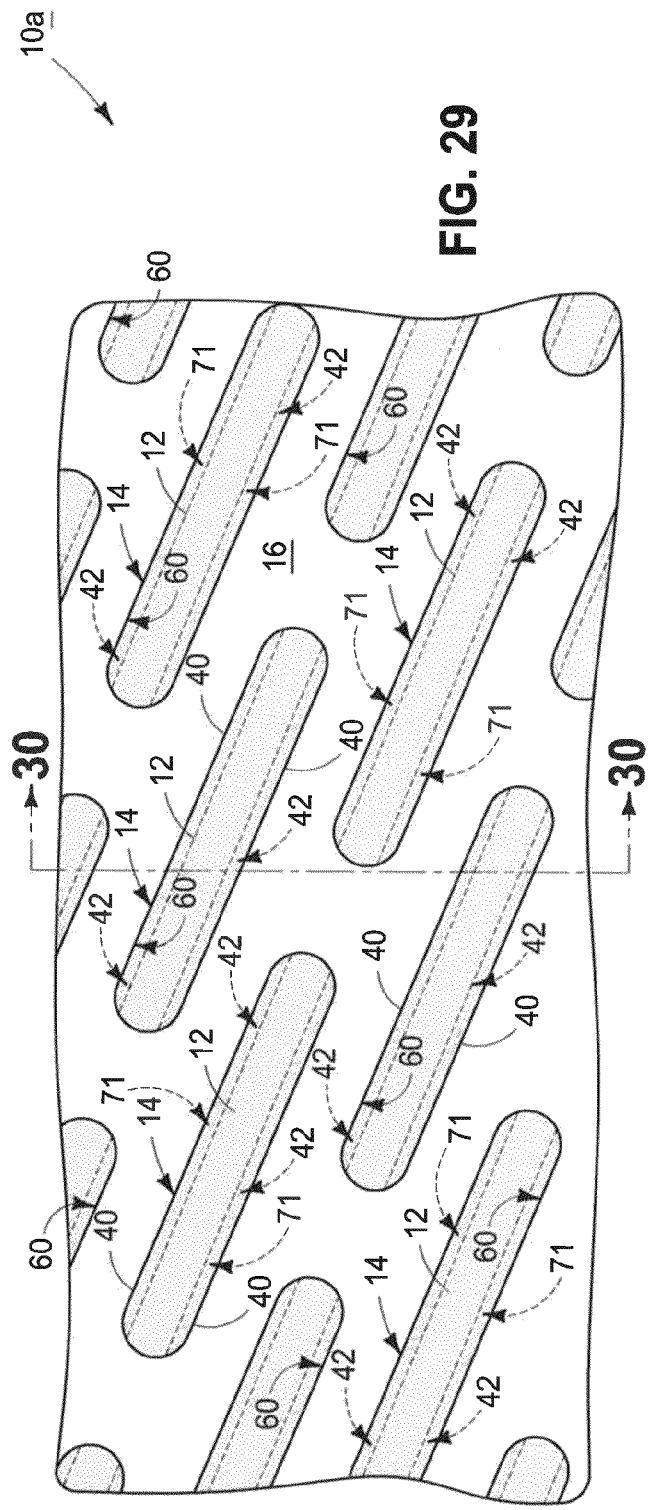
FIG. 29 is a view of the FIG. 27 substrate at a processing step subsequent to that shown by FIG. 27.
Figure 30:
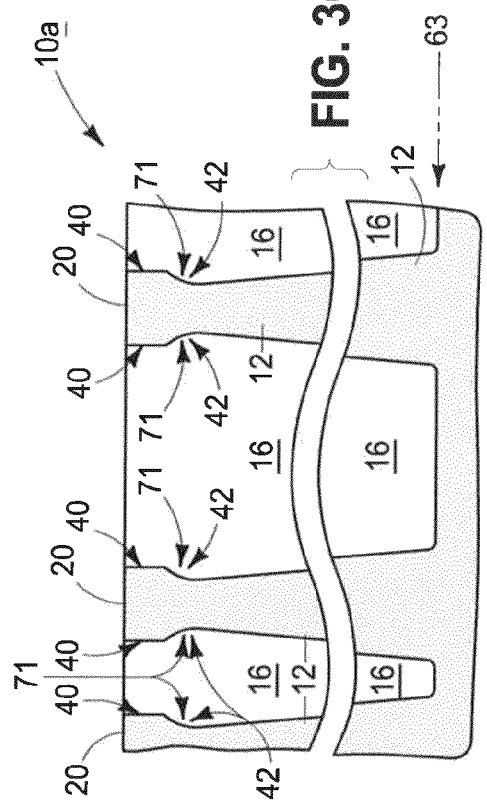
FIG. 30 is a diagrammatic sectional view taken through line 30-30 in FIG. 29.

Referring to FIGS. 29 and 30, dielectric trench isolation material 16 has been formed in extended isolation trenches 60, including projecting portions 71, to form dielectric projections 42 extending laterally into opposing sides 40 of individual active area regions 14 under elevationally outermost surface 20. Semiconductor material 12 is elevationally over dielectric projections 42.

Referring to FIGS. 31 and 32, individual contact openings 57 have been etched into semiconductor material 12 at a mid-portion 45 of individual active area regions 14 to form a mid-portion semiconductor material surface 44 that is elevationally inward relative to elevationally outermost surface 20 of semiconductor material 12 in individual active area regions 14. Dielectric material 53 may be formed (FIG. 32, not shown in FIG. 31 for clarity in FIG. 31), with contact openings 57 being formed there-through.

Processing could continue, for example, in fabricating the structure of FIGS. 5 and 6. Thereby, conductive lines 46 may be formed which individually extend transversally across and elevationally over mid-portions 45 of active area regions 14. Conductive material (e.g., material 47) is directly against mid-portion surface 44 of individual active area regions 14 and is conductively coupled to or with the conductive line 46 transversally crossing thereover. Further subsequent processing may occur, for example to produce structure like that of FIGS. 7 and 8, or otherwise.

In one embodiment and prior to etching the contact openings, recessed access gate lines may be formed which individually extend transversally across active area regions 14 and also extend between ends of immediately end-to-end adjacent active area regions within the dielectric trench isolation material. For example referring to FIGS. 31 and 32 again, recessed access gate lines 26 and source/drain regions 36 may be formed before forming contact openings 57.

Method embodiments of the invention also encompass a combination of the above generally described methods whereby, for example, dielectric end projections 24 and dielectric lateral projections 42 are both formed (e.g., at the same time or separately).

CONCLUSION

In some embodiments, a method of forming an array of recessed access gate lines comprises etching isolation trenches into semiconductor material to a first depth to define active area regions. The isolation trenches are etched deeper into the semiconductor material to a second depth. The etching to the second depth projects the isolation trenches longitudinally into opposing ends of individual active area regions below the first depth. Dielectric trench isolation material is formed in the extended isolation trenches including projecting portions thereof to form dielectric projections extending into the opposing ends of the individual active area regions under an elevationally outermost surface of the semiconductor material of the active area regions. The semiconductor material is elevationally over the dielectric projections. Recessed access gate lines are formed which individually extend transversally across the active area regions and extend between the ends of immediately end-to-end adjacent active area regions within the dielectric trench isolation material.

In some embodiments, a method of forming an array of conductive lines comprises etching isolation trenches into semiconductor material to a first depth to define active area regions. The isolation trenches are etched deeper into the semiconductor material to a second depth. The etching to the second depth projects the isolation trenches laterally into opposing sides of individual active area regions below the first depth. Dielectric trench isolation material is formed in the extended isolation trenches including projecting portions thereof to form dielectric projections extending laterally into the opposing sides of the individual active area regions under an elevationally outermost surface of the semiconductor material of the active area regions. The semiconductor material is elevationally over the dielectric projections. A contact opening is etched into the semiconductor material at a mid-portion of the individual active area regions to form a mid-portion semiconductor material surface that is elevationally inward relative to the elevationally outermost surface of the semiconductor material in the individual active area regions. Conductive lines are formed that individually extend transversally across and elevationally over the mid-portions of the active area regions. Conductive material is directly against the mid-portion surface of the individual active area regions and is conductively coupled to the conductive line transversally crossing thereover.

In some embodiments, a method of forming an array of recessed access gate lines and an array of conductive lines comprises etching isolation trenches into semiconductor material to a first depth to define active area regions. The isolation trenches are etched deeper into the semiconductor material to a second depth. The etching to the second depth projects the isolation trenches longitudinally into opposing ends of individual active area regions below the first depth and projects the isolation trenches laterally into opposing sides of the individual active area regions below the first depth. Dielectric trench isolation material is formed in the extended isolation trenches including projecting portions thereof to form dielectric end projections extending into the opposing ends of the individual active area regions under an elevationally outermost surface of the semiconductor material of the active area regions and to form dielectric lateral projections extending laterally into the opposing sides of the individual active area regions under the elevationally outermost surface of the semiconductor material of the active area regions. The semiconductor material is elevationally over the end and lateral dielectric projections. Recessed access gate lines are formed which individually extend transversally across the active area regions and extend between the ends of immediately end-to-end adjacent active area regions within the dielectric trench isolation material. After forming the recessed access gate lines, a contact opening is etched into the semiconductor material at a mid-portion of the individual active area regions to form a mid-portion semiconductor material surface that is elevationally inward relative to the elevationally outermost surface of the semiconductor material in the individual active area regions. Conductive lines are formed that individually extend transversally across and elevationally over the mid-portions of the active area regions. Conductive material is directly against the mid-portion surface of the individual active area regions and is conductively coupled to the conductive line transversally crossing thereover.

In some embodiments, an array of recessed access gate lines comprises active area regions having dielectric trench isolation material there-between. The trench isolation material comprises dielectric projections extending into opposing ends of individual active area regions under an elevationally outermost surface of material of the active area regions. The active area material is elevationally over the dielectric projections. Recessed access gate lines individually extend transversally across the active area regions and extend between the ends of immediately end-to-end adjacent active area regions within the dielectric trench isolation material.

In some embodiments, an array of conductive lines comprises active area regions having dielectric trench isolation material there-between. The trench isolation material comprises dielectric projections extending laterally into opposing sides proximate opposing ends of individual active area regions under an elevationally outermost surface of material of the active area regions proximate the opposing ends. The active area material is elevationally over the dielectric projections proximate the opposing ends. Conductive lines individually extend transversally across and elevationally over a mid-portion of the individual active area regions. Conductive material is directly against a mid-portion surface of the active area material of the individual active area regions and is conductively coupled to the conductive line transversally crossing thereover. The mid-portion surface is elevationally inward relative to the elevationally outermost surface of the active area material in the individual active area regions proximate the opposing ends.

In some embodiments, an array of conductive lines comprises active area regions having dielectric trench isolation material there-between. The trench isolation material comprises dielectric projections extending laterally into opposing sides proximate opposing ends of individual active area regions under an elevationally outermost surface of material of the active area regions proximate the opposing ends. The active area material is elevationally over the dielectric projections proximate the opposing ends. Conductive lines individually extend transversally across and elevationally over a mid-portion of the individual active area regions. Conductive material is directly against a mid-portion surface of the active area material of the individual active area regions and is conductively coupled to the conductive line transversally crossing thereover. The individual active area regions are longitudinally elongated along a straight longitudinal axis. The mid-portion surface is laterally narrower perpendicular to the longitudinal axis than the elevationally outermost surfaces proximate the opposing ends.

In some embodiments, an array of recessed access gate lines and conductive lines comprises active area regions having dielectric trench isolation material there-between. The trench isolation material comprises dielectric end projections extending into opposing ends of individual active area regions under an elevationally outermost surface of material of the active area regions. The active area material is elevationally over the dielectric end projections. The trench isolation material comprises dielectric lateral projections extending laterally into opposing sides proximate the opposing ends under an elevationally outermost surface of the active area material proximate the opposing ends. The active area material is elevationally over the dielectric end projections proximate the opposing ends. Recessed access gate lines individually extend transversally across the active area regions and extend between the ends of immediately end-to-end adjacent active area regions within the dielectric trench isolation material. Conductive lines individually extend transversally across and elevationally over a mid-portion of the individual active area regions. Conductive material is directly against a mid-portion surface of the active area material of the individual active area regions and is conductively coupled to the conductive line transversally crossing thereover. The mid-portion surface is elevationally inward relative to the elevationally outermost surface of the active area material in the individual active area regions proximate the opposing ends.

In some embodiments, an array of recessed access gate lines and conductive lines comprises active area regions having dielectric trench isolation material there-between. The trench isolation material comprises dielectric end projections extending into opposing ends of individual active area regions under an elevationally outermost surface of material of the active area regions. The active area material is elevationally over the dielectric end projections. The trench isolation material comprises dielectric lateral projections extending laterally into opposing sides proximate the opposing ends under an elevationally outermost surface of the active area material proximate the opposing ends. The active area material is elevationally over the dielectric end projections proximate the opposing ends. Recessed access gate lines individually extend transversally across the active area regions and extend between the ends of immediately end-to-end adjacent active area regions within the dielectric trench isolation material. Conductive lines individually extend transversally across and elevationally over a mid-portion of the individual active area regions. Conductive material is directly against a mid-portion surface of the active area material of the individual active area regions and is conductively coupled to the conductive line transversally crossing thereover. The individual active area regions are longitudinally elongated along a straight longitudinal axis. The mid-portion surface is laterally narrower perpendicular to the longitudinal axis than the elevationally outermost surfaces proximate the opposing ends.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming an array of recessed access gate lines, comprising:
   etching isolation trenches into semiconductor material to a first depth to define active area regions;
   etching the isolation trenches deeper into the semiconductor material to a second depth, the etching to the second depth projecting the isolation trenches longitudinally into opposing longitudinal ends of individual active area regions below the first depth;
   forming dielectric trench isolation material in the extended isolation trenches including projecting portions thereof to form dielectric projections extending into the opposing longitudinal ends of the individual active area regions under an elevationally outermost surface of the semiconductor material of the active area regions, the semiconductor material being elevationally over the dielectric projections; and
   forming recessed access gate lines which individually extend transversally across the active area regions and extend between the longitudinal ends of immediately end-to-end adjacent active area regions within the dielectric trench isolation material.

2. The method of claim 1 wherein the deeper etching does not project the isolation trenches into opposing sides of the individual active area regions longitudinally along all of the individual active area regions below the first depth.

3. The method of claim 1 wherein the deeper etching projects the isolation trenches into opposing sides of the individual active area regions longitudinally along all of the individual active area regions below the first depth.

4. The method of claim 1 wherein the deeper etching comprises:
forming masking material over sidewalls and bases of the isolation trenches that have been etched to the first depth, the masking material being thicker centrally over the isolation trench bases that are between immediately side-to-side adjacent active area regions than centrally over the isolation trench bases that are between immediately end-to-end adjacent active area regions;
etching the masking material to centrally expose the isolation trench bases that are between immediately end-to-end adjacent active area regions but not expose the isolation trench bases that are centrally between immediately side-to-side adjacent active area regions;
first etching the semiconductor material to project the isolation trenches longitudinally into opposing longitudinal ends of individual active area regions below the first depth;
after the first etching, removing all of the masking material from the isolation trenches; and
after the removing, second etching the semiconductor material to the second depth.

5. A method of forming an array of conductive lines, comprising:
etching isolation trenches into semiconductor material to a first depth to define active area regions;
etching the isolation trenches deeper into the semiconductor material to a second depth, the etching to the second depth projecting the isolation trenches laterally into opposing sides of individual active area regions below the first depth;
forming dielectric trench isolation material in the extended isolation trenches including projecting portions thereof to form dielectric projections extending laterally into the opposing sides of the individual active area regions under an elevationally outermost surface of the semiconductor material of the active area regions, the semiconductor material being elevationally over the dielectric projections;
etching a contact opening into the semiconductor material at a longitudinally central portion of the individual active area regions to form a longitudinally central semiconductor material elevationally outer surface that is elevationally inward relative to the elevationally outermost surface of the semiconductor material in the individual active area regions; and
forming conductive lines that individually extend transversally across and elevationally over the longitudinally central portions of the active area regions, conductive material being directly against the longitudinally central semiconductor material elevationally outer surface of the individual active area regions and being conductively coupled to the conductive line transversally crossing thereover.

6. The method of claim 5 comprising, prior to etching the contact openings, forming recessed access gate lines which individually extend transversally across the active area regions and extend between the longitudinal ends of immediately end-to-end adjacent active area regions within the dielectric trench isolation material.

7. A method of forming an array of recessed access gate lines and an array of conductive lines, comprising:
etching isolation trenches into semiconductor material to a first depth to define active area regions;
etching the isolation trenches deeper into the semiconductor material to a second depth, the etching to the second depth projecting the isolation trenches longitudinally into opposing longitudinal ends of individual active area regions below the first depth and projecting the isolation trenches laterally into opposing sides of the individual active area regions below the first depth;
forming dielectric trench isolation material in the extended isolation trenches including projecting portions thereof to form dielectric end projections extending into the opposing longitudinal ends of the individual active area regions under an elevationally outermost surface of the semiconductor material of the active area regions and to form dielectric lateral projections extending laterally into the opposing sides of the individual active area regions under the elevationally outermost surface of the semiconductor material of the active area regions, the semiconductor material being elevationally over the longitudinal end and lateral dielectric projections;
forming recessed access gate lines which individually extend transversally across the active area regions and extend between the longitudinal ends of immediately end-to-end adjacent active area regions within the dielectric trench isolation material;
after forming the recessed access gate lines, etching a contact opening into the semiconductor material at a longitudinally central portion of the individual active area regions to form a longitudinally central semiconductor material elevationally outer surface that is elevationally inward relative to the elevationally outermost surface of the semiconductor material in the individual active area regions; and
forming conductive lines that individually extend transversally across and elevationally over the longitudinally central portions of the active area regions, conductive material being directly against the longitudinally central semiconductor material elevationally outer surface of the individual active area regions and being conductively coupled to the conductive line transversally crossing thereover.

* * * * *